United States Patent [19]

Vegesna et al.

[11] Patent Number: 5,226,142
[45] Date of Patent: Jul. 6, 1993

[54] HIGHH PERFORMANCE REGISTER FILE WITH OVERLAPPING WINDOWS

[75] Inventors: Anantakotiraju Vegesna, Austin, Tex.; Steve Studulski, Millbrae, Calif.; Peter Jewett; Sang Yoo, both of Austin, Tex.

[73] Assignee: Ross Technology, Inc., Austin, Tex.

[21] Appl. No.: 615,704

[22] Filed: Nov. 21, 1990

[51] Int. Cl.$^5$ .............................................. G06F 9/34
[52] U.S. Cl. ............................... 395/425; 364/DIG. 1
[58] Field of Search ................ 364/200 MS, 900 MS; 395/400 MS, 425 MS

[56] References Cited

U.S. PATENT DOCUMENTS

| | | | |
|---|---|---|---|
| 4,569,016 | 2/1986 | Hao et al. | 395/375 |
| 4,734,852 | 3/1988 | Johnson et al. | 395/250 |
| 4,777,588 | 10/1988 | Case et al. | 395/800 |
| 5,019,968 | 5/1991 | Wang et al. | 395/800 |
| 5,083,263 | 1/1992 | Joy et al. | 395/425 |
| 5,109,514 | 4/1992 | Garner et al. | 395/800 |
| 5,109,524 | 4/1992 | Wagner et al. | 395/800 |

Primary Examiner—Joseph L. Dixon
Assistant Examiner—Reba I. Elmore
Attorney, Agent, or Firm—Irell & Manella

[57] ABSTRACT

A register file within a central processing unit which processes operations on operands stored in the register file is disclosed. The register file includes a plurality of memory locations and each of the memory locations provides the physical storage for one or more registers. Each memory location stores one of the operands. The register file also includes a plurality of windows and each of the windows provides a unique mapping of the same set of registers to an equal number of memory location and each window includes the same quantity of one or more registers. A pointer points to one of the windows of the register file for indicating which window is currently active. Each of the memory locations is coupled to at least one multiplexer. The active memory locations of the active window, currently assigned to provide storage for the registers, simultaneously output to the at least one multiplexer the operands stored in the registers. Each of the at least one multiplexers obtains one of the operands of the active window and outputs the operand to the central processing unit for processing.

13 Claims, 9 Drawing Sheets

| REGISTER NUMBERS | NAME |
|---|---|
| r[24] to r[31] | ins |
| r[16] to r[23] | locals |
| r[8] to r[15] | outs |
| r[0] to r[7] | globals |

HIGHH PERFORMANCE REGISTER FILE WITH OVERLAPPING WINDOWS

FIELD OF INVENTION

The present invention relates to an apparatus and method for enhancing the performance of a central processing unit of a computer system by minimizing the central processor's need to fetch and store operands from and to main memory. The technique employed is frequently referred to as register windowing.

BACKGROUND OF INVENTION

The central processing unit ("CPU") of a computer fetches program instructions and data from the computer system's main memory and performs logical or mathematical operations on the data as specified by the instructions. The CPU accesses the data to be operated upon ("source operands") by importing a copy of the data into its own internal memory called CPU registers. The results of the operations performed by the CPU (e.g. addition, subtraction etc.) on the source operands are also stored in other CPU registers. Each CPU operation requires at least one, and usually two source operands, plus a result or destination operand. The CPU spends a predominant amount of time fetching and storing these operands. Because computer system performance is largely measured by program execution speed, the ability to reduce CPU access (e.g. fetching and storing) time is critical to improving the system's performance.

An accepted approach for reducing the CPU operand access time is to provide a register file on board the CPU, a relatively small block of memory that provides physical storage for the CPU registers. CPU access to operands stored in the register file is inherently faster than for those stored in main memory. The register file is small enough to reside on the same integrated circuit (chip) as the CPU. Because the signal path delays are shorter between circuits on the same chip than for circuits between chips, faster access to operands occurs. The address word for the register file is smaller than the address word for main memory and therefore the decode time for the address word for the register file should be shorter than the decode time for an address word for main memory. Additionally, the smaller number of devices used for implementing the register file compared to main memory reduces associated parasitic capacitance, thus further reducing data path delay.

The purpose of a register file is to provide fast CPU access to an optimal number of operands, thus minimizing the number of times the CPU must fetch and store operands from and to main memory and thereby enhancing CPU execution speed.

There are two architectural constraints to consider when designing a register file. First, the number of CPU registers is constrained by the number of bits conveniently available to the CPU for addressing the registers. The address bits are included in the CPU instruction word, which is limited in length by the number of bits comprising the data path of the computer. Typically, five bits are set aside for addressing a total of thirty-two CPU registers.

The second constraint, which influences the organization of the register file, is the inherent characteristics of the computer programs which run on the computer system. Programs are generally comprised of a plurality of separate procedures which are called and executed multiple times during program execution. Each procedure may have its own set of operands necessary for its execution. Some of the operands are local; they are not shared among all of the other procedures in the program. Other operands are global; they are shared among all of the procedures in the program. Thus, if the register file were limited to just thirty-two memory locations to provide storage for the thirty-two registers, each time a new procedure was executed, a new set of operands would have to be imported from main memory. The operands required for the previous procedure would be over-written and would no longer be available the next time that procedure is called for execution.

The typical register file is a memory array, its physical storage locations organized into fixed size windows (i.e. blocks of memory). Each window represents a unique mapping of the thirty-two CPU registers onto an equal number of physical storage locations in the memory array. Each window typically contains twenty-four memory locations which are all allocated to provide physical storage for the local registers. Local registers are used to store local operands. A separate set of eight memory locations is allocated to provide storage for global registers, which are used to store global operands.

Thus, for each window the twenty-four window registers are assigned to a different block of memory. In other words, each time a new procedure is called by the program under execution, a new window of memory locations is assigned to the same registers. The previous procedure's operands are saved in one window of memory, while the operands unique to the second procedure reside in a different block or window of memory. Therefore, though the procedures use the same registers, they each use those registers with a different set of memory locations assigned to provide storage for the registers. In this way, the operands unique to one procedure may be stored and left uncompromised while another procedure is using the same registers to store its unique operands. As a result, the CPU does not have to re-import operands from external memory every time it jumps from one procedure to another.

The number of windows in a register file is determined by the level of nesting which can occur during program execution. Nesting occurs when a procedure A, while being executed, calls for the execution of a procedure B, which might then call for execution of a procedure C, and so forth. Once the last procedure called has been completed (i.e. procedure C), the CPU returns to and completes the execution of calling procedure B. Upon completing procedure B, the CPU returns and completes execution of calling procedure A.

Professors Hennessey and Patterson in "Computer Architecture, A Quantitative Approach," *Morgan Kaufman Publishers, Inc.* (1990) at pages 450-451, provide illustrations depicting program nesting in the context of having to fetch operands from main memory when the register file is full or empty. Referring to FIG. 1, a diagram representing the nesting constraint is shown. The x axis is representative of time, measured in procedure calls or returns; the y axis is representative of the depth of nesting of procedure calls. Each call moves the nesting down the y axis, and each return moves the nesting up the y axis. The boxes show main memory being accessed either when the register file is full and there is a procedure call (window overflow) or when the register file is empty and there is a return (window underflow). FIG. 1 shows eight window overflows and two window underflows during a particular section of a hypothetical program execution. Over the life of any program, the number of overflows and underflows should equal one another.

FIG. 2 shows the shape of a curve representative of the number of register windows versus the overflow rate for different programs in C, LISP and Small Talk. The knee of the curve occurs between six and eight windows. While six to eight windows appear to be optimal for most programs, there may be specific program patterns of calls and returns that could be quite different than those shown in FIG. 2. For example, in the worst case there might be hundreds of calls followed by hundreds of returns and thus the register file would have to have many windows to accommodate all of the levels of nesting.

An example of a typical register file is the one employed in the CY7C601 and CY7C611 products sold by Ross Technology, Austin, Tex. The register file on these chips has a memory array of one-hundred thirty-six memory locations which are each thirty-two bits long and are allocated such that one-hundred twenty-eight memory locations provide storage for the twenty-four local registers, and a set of eight memory locations provides storage for the eight global registers. The one-hundred twenty-eight local memory locations are mapped into eight windows of twenty-four memory locations each. Each window represents the same twenty-four local registers, but each window maps those twenty-four registers onto a different set of twenty-four memory locations. Only one window of memory locations is active at a time (the window visible to the programmer) and it is identified by a current window pointer (CWP), which is a three bit word stored in the CPU's state register. At any given time, a program can address thirty-two active registers: twenty-four local registers and eight global registers. By convention the local registers are classified into three groups: eight "in" registers, eight "local" registers, and eight "out" registers. The operands stored in the "in" and "out" (i.e. "shared") registers are not purely local, but can be passed from and to adjacent windows to enable other procedures to utilize the operands. The "in" and "out" registers are only shared with adjacent windows, therefore they are not global. The "local" registers are never shared; they are purely local. FIG. 3 is a table of the register naming convention for any window currently pointed to in the CY7C601 and CY7C611 implementations.

In the CY7C601 and CY7C611 the CWP points to a stack of one-hundred twenty-eight, thirty-two bit memory locations. The register file address is an eight bit word which is decoded to select and access one of the register file's one hundred thirty-six memory locations. The CWP comprises the three most significant bits of the register file address. Thus, an increment (or decrement) of the current window pointer offsets the decoded value of the register file address by sixteen. Twenty-four memory locations are accessed for a single CWP value, however, thus providing a window overlap of eight memory locations. This overlap in window memory locations creates an effective overlap of window registers which is used to pass parameters from one window to either of its two adjacent windows.

There are drawbacks to the typical register file implementations used today. First, there is a time delay associated with decoding the address bits which point to a particular memory location (the register file address) in the register file's memory array. Second, there is a time delay (access time) associated with either retrieving an operand stored in the register file memory array, or storing a new operand in the register file memory array. Third, the current implementations do not adapt well to the parallel launching of more than one instruction. Today's CPU architectures can launch and execute more than one instruction per-clock cycle, requiring simultaneous access to multiple operands. The conventional implementations can provide simultaneous multiple operand access, but at a cost of increased circuit size in the register file memory array, resulting in a much greater operand access time.

SUMMARY OF THE INVENTION

Due to the current trend of producing computer systems that operate at ever increasing clock frequencies, there is a need to make register file operation more efficient. In addition, there is a desire to make these register files even larger for storing more operands locally to the CPU. Finally, register files must provide simultaneous access to multiple operands without impacting register access time. For register files to keep up with increasing clock speeds, and to overcome the demands for both larger memory size and multiple operand access, the register file access time must be reduced. The present invention provides a faster, more efficient and more easily adaptable method and circuit implementation for meeting the current demands placed on register files.

Briefly, the improved performance of the preferred embodiment of the invention is realized through a number of factors. First, three CWP bits are separately decoded to access an entire window of twenty-four memory locations providing storage for twenty-four window registers simultaneously. Operand data from all twenty-four accessed memory locations (registers) is thereby presented concurrently to the input of a thirty-two to one multiplexer, along with operand data from the eight memory locations providing storage for the eight global registers. The CPU may then access the operand data stored within anyone of its thirty-two registers by issuing the register's unique five bit register address separately to the multiplexer. Once this address is decoded, the selected data is transmitted to the output of the multiplexer. Similarly, data may be stored into any one of the thirty-two accessed registers by presenting the data to be stored on the thirty-two bit input bus of a one to thirty-two data selector. The CPU then issues the specific register's unique five bit register address to the data selector, which passes the data to the memory location assigned to that register for storage.

The CWP value is always updated and available before the CPU is ready to begin accessing particular registers from the current window. Thus, the task of accessing the twenty-four memory locations assigned to the current window to provide storage for the registers (i.e. which includes the CWP decode time plus the memory array access time) is completed before the CPU is ready to access any of its registers. The time to perform this function is thereby completely eliminated from the CPU register access time. The CPU register access time in the preferred embodiment is thereby limited to the five bit register address decode time, plus the propagation delay associated with transmitting the selected operand through the multiplexer or data selector.

The CPU register access time associated with the prior art register file is longer than the preferred embodiment of the invention for two reasons. First, eight bits of address (the CWP plus the five bit register address) must be decoded every time a register is accessed, whereas only five bits are decoded for register access in the present invention. Second, prior art register files require each CPU access of a register to be made through the register file memory array, which has a much longer propagation delay than does the multiplexer used in the preferred embodiment of the invention.

Additionally, prior art register file implementations cannot be efficiently adapted for obtaining multiple operands simultaneously. The prior art register file adaptations for this purpose require additional devices in the memory cell circuits of the register file memory array, which adversely affect access time. The architecture of the preferred embodiment of the present invention accommodates multiple operand access through the addition of any number of multiplexers (or data selectors) equal to the desired number of operands to be accessed simultaneously. The addition of multiplexers (or data selectors) for this purpose will not significantly impact operand access time because the operands are made available to each multiplexer (or data selector) in parallel. Although the addition of multiplexers will increase the parasitic capacitance on the Global 118, Local 120, Odd-Op 122 and Even-Op 124 output lines (FIG. 8), the resulting increased delay Will be insignificant compared to the delay through the multiplexer. These insignificant delays may be eliminated simply by increasing the size of the output devices driving the previously identified output lines.

Lastly, in order to implement the above described methodology, the preferred embodiment of the invention includes a RAM array with a novel interleaved architecture necessary to permit the sharing of certain RAM bit cells (those cells providing physical storage for the "in" and "out" registers), the sharing of which effectuates the overlap of the register windows.

Briefly, the preferred embodiment of the invention includes a register file within a central processing unit. The central processing unit processes operations on operands stored in the register file. The register file includes the following elements.

A plurality of memory locations and each memory location provides the physical storage for one or more registers. Each of the memory locations stores one of the operands. A plurality of windows, each window providing a unique mapping of the same set of registers to an equal number of memory locations and each of the windows including the same quantity of one or more of the registers. A pointer means for pointing to one of the windows of the register file. The pointer means identifies which of the windows of the register file is currently active by accessing those memory locations which are assigned by convention to the current window to provide storage for the registers.

Each of the memory locations is coupled to at least one multiplexer means and to at least one data selector means. The memory locations of the active window simultaneously output to at least one multiplexer means the operands stored in the memory locations. Each of the at least one multiplexer means selects one of the operands stored in the memory locations assigned to the active window and outputs the obtained operand to the central processing unit for processing. The CPU obtains an operand from one of its registers by selecting the operand data stored in the memory location assigned to provide storage for that register under the currently active window. The memory locations of the active window simultaneously have the potential to receive new operands from each of the at least one data selector means. Each of the at least one data selectors can receive results operands from the CPU for storage in any of the memory locations of the active window assigned to provide storage for its registers. The CPU stores a new operand into one of its registers by storing the operand into the specific memory location assigned to provide storage for that register under the currently active window.

DETAILED DESCRIPTION

I. CONVENTIONAL REGISTER FILE IMPLEMENTATIONS

Figure 1:
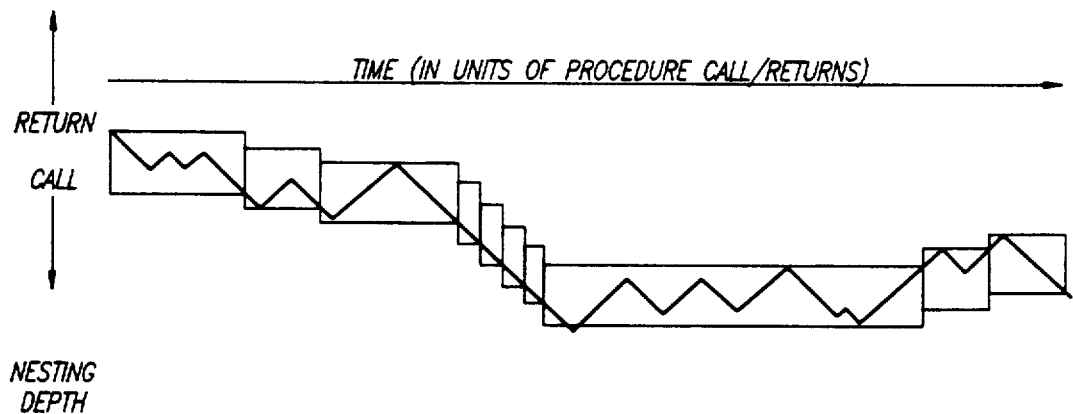
FIG. 1 is an illustration showing procedure nesting depth over time for a typical program in the context of having to fetch operands from main memory when the register file is full or empty.
Figure 2:
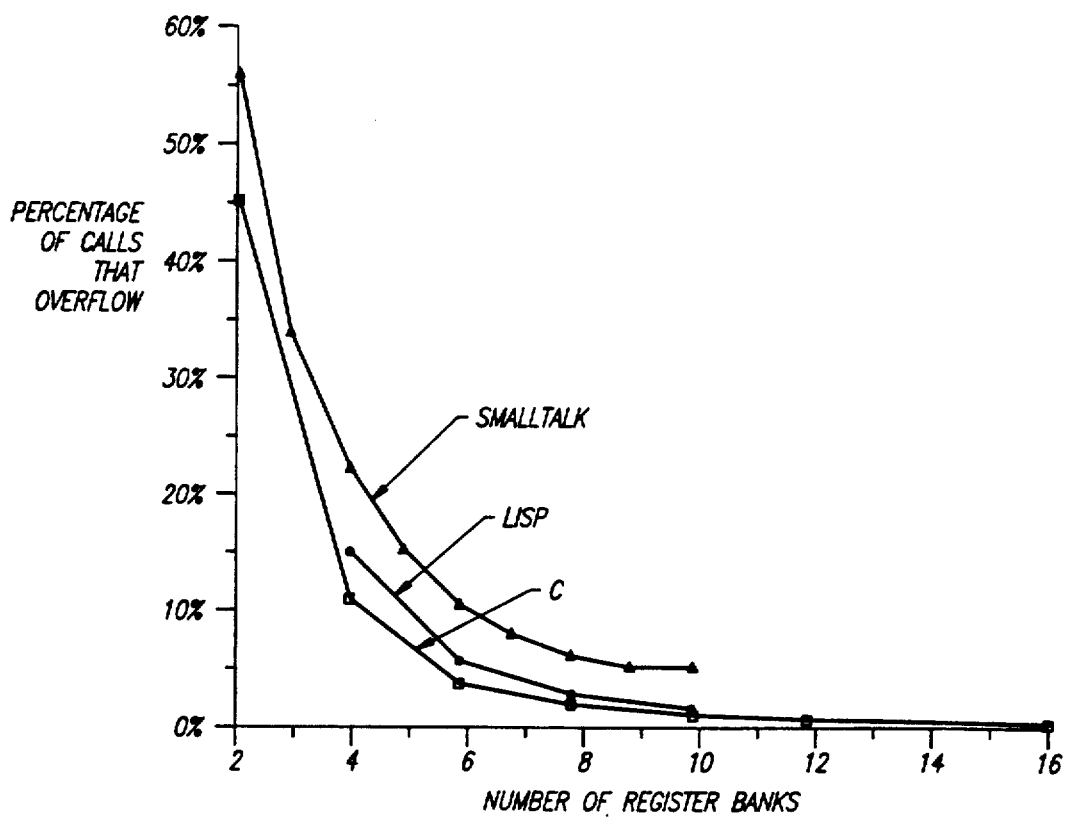
FIG. 2 shows a curve depicting the number of windows of registers versus overflow rate for different program languages including C, LISP and Small Talk.
Figures 3, 4:
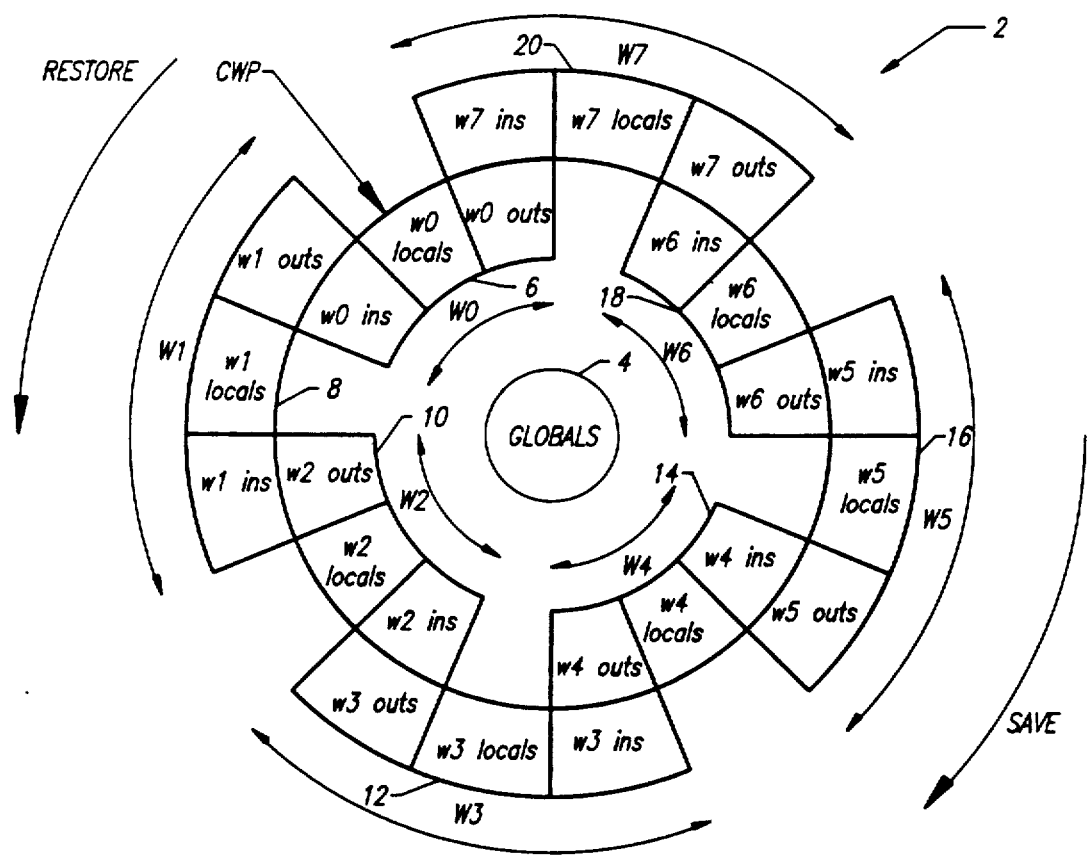
FIG. 3 is a table showing the nomenclature for the available registers of an active window.
FIG. 4 depicts a prior art circular stack implementation of a register file.

Referring to FIG. 4, a diagram of a register file implemented as a circular stack 2 is shown. The circular stack 2 is implemented with eight windows: w-0(6), w-1(8), W-2(10), W-3(12), w-4(14), W-5(16), w-6(18), and W-7(20). Each Window contains twenty-four local registers including eight "in" registers, eight "local" registers and eight "out" registers. Each window is shown partitioned into three parts according to whether the registers are considered "ins", "locals" or "outs." There are also eight global registers 4 shown at the center of the circular stack.

Note that the registers labeled "in" and "out" overlap with the adjacent window's "out" and "in" registers respectively. This circular register window configuration provides an efficient means for passing parameters during procedure calls and returns. One method of implementing a procedure call that takes advantage of the overlap is to have the calling procedure move the parameter to be passed into its "out" registers, and then execute a CALL INSTRUCTION (SPARC). A CALL INSTRUCTION (SPARC) decrements the CWP to activate the next window adjacent to the currently active window. The calling procedure's "outs" become the called procedure's "ins", making the passed parameters directly accessible during execution of the new procedure.

When a called procedure is ready to return results to the procedure that called it, the results are moved into its "in" registers and a return occurs, usually with a RESTORE INSTRUCTION (SPARC). A RESTORE INSTRUCTION (SPARC) increments the CWP to activate the previous window. The called procedure's "in" registers are still the calling procedure's "out" registers; thus, the results are available to the calling procedure during completion of its execution. Note that the terms "in" and "out" are defined relative to the calling procedure and not the returning procedure.

No matter how many windows a register file has, it is possible that at some point the program may try to use more windows than available; the level of nesting exceeds the number of windows available. In this case, the CWP will simply "overflow" back to zero, pointing back to and thereby activating Window Zero. On an overflow, the local operands first stored in the window during a previous procedure will be saved to external memory. The operands local to the overflowing routine will have to be obtained from the external memory and then stored in the active window. As discussed earlier, however, in a typical scenario the depth of nesting will rarely exceed eight. Thus, only eight windows are typically required.

Figure 5:
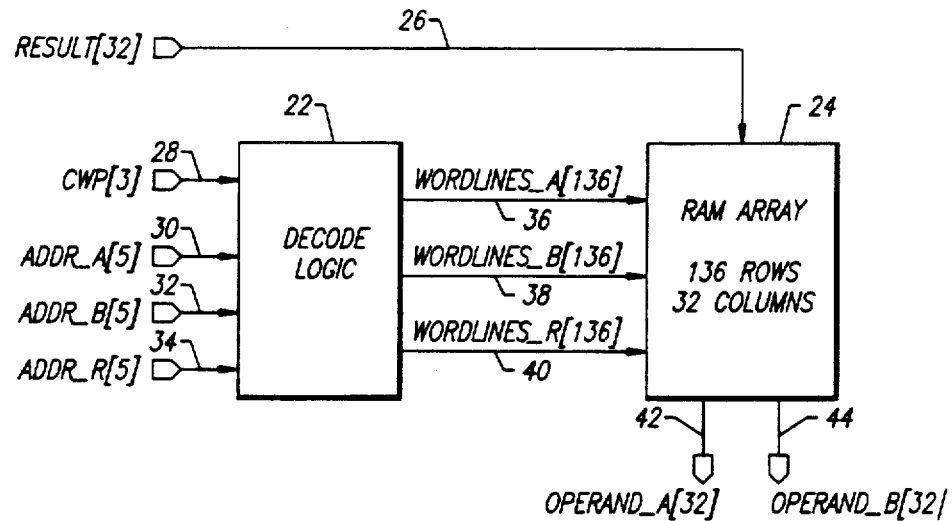
FIG. 5 depicts a prior art implementation of a register file.

Referring to FIG. 5, a typical hardware implementation of a Prior Art register file with overlapping windows is shown. The register file is implemented with a multiport RAM Array 24 containing one-hundred thirty-six rows of thirty-two bit memory locations. Each memory location can be used to provide the physical storage for one or more CPU registers.

The RAM Array 24 has a thirty-two bit input port (RESULT 26) and two thirty-two bit output ports (OPERAND-A 42 and OPERAND-B 44). Decode Logic 22 decodes an eight-bit address consisting of the three bit CWP 28 in combination with one of three five bit register addresses: ADDR-A 30, ADDR-B 32 and ADDR-R 34. Decoding the CWP 28 in combination with ADDR-A 30 activates one of one-hundred thirty-six word select lines (Wordlines-A 36) which are input into the RAM Array 24. Decoding the CWP 28 in combination with ADDR-B 32 activates one of one-hundred thirty-six word select lines (Wordlines-B 38) which are also input into the RAM Array 24. Finally, decoding the CWP 28 in combination with ADDR-R 34 activates one of one-hundred thirty-six word select lines (Wordlines-R 40) which are also input into RAM Array 24. Note that the eight-bit address decodes can up to two-hundred fifty-six wordlines, but only the lowest one-hundred thirty-six are used.

Each of the Wordlines-A 36, Wordlines-B 38 and Wordlines-R 40 connects to one of the one-hundred thirty-six rows of the RAM Array 24. When one of the Wordlines-A 36 becomes active, the data contained in the row to which it connects becomes available on the thirty-two bit output port OPERAND-A 42. When one of the Wordlines-B 38 becomes active, the data contained in the row to which it connects becomes available on the thirty-two bit output port OPERAND-B 44. Finally, when one of the Wordlines-R 40 becomes active, the row to which it connects becomes enabled to receive and store new data present at the thirty-two bit input port RESULT 26.

Figure 6:
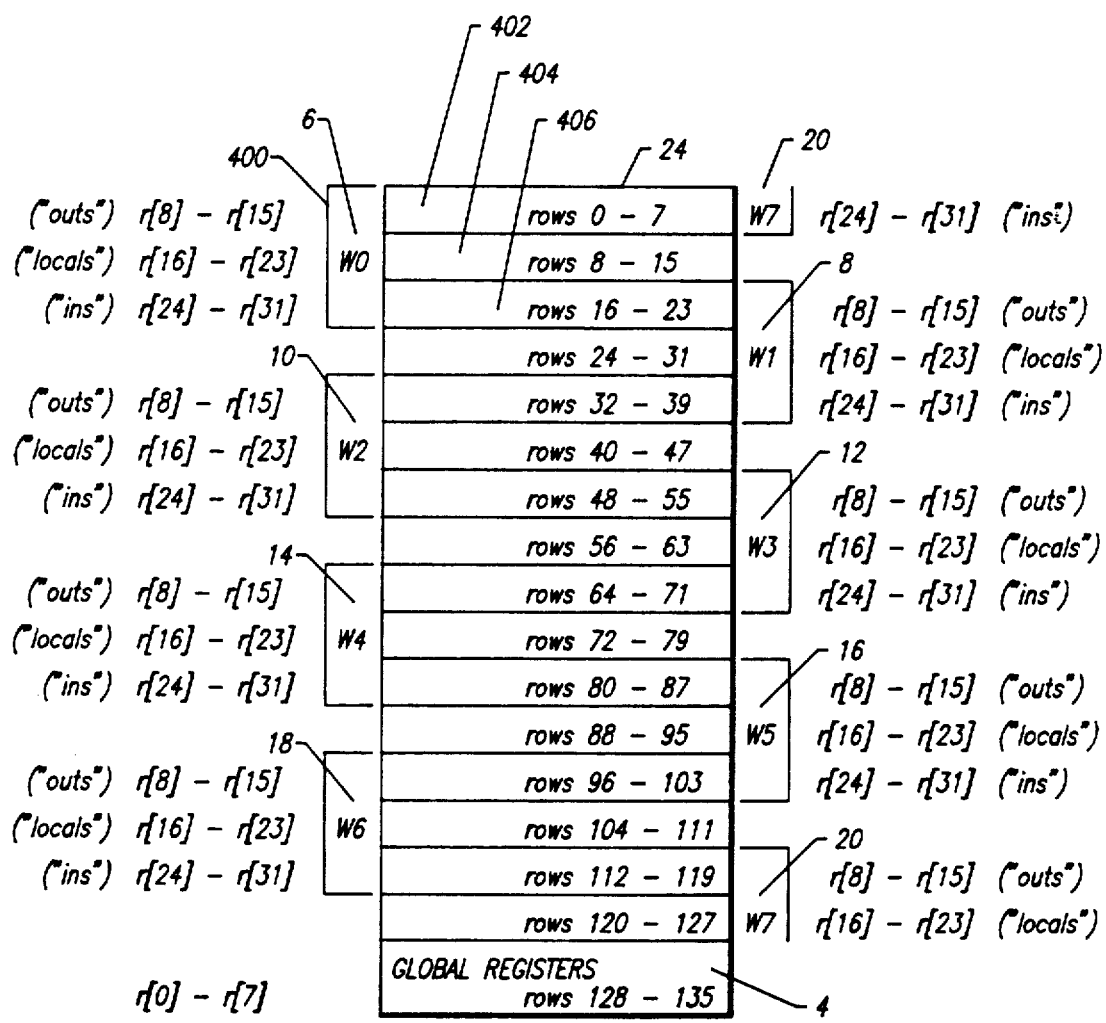
FIG. 6 depicts the windowing of a prior art register file RAM array.

Referring to FIG. 6, the one-hundred thirty-six rows of memory locations are divided into eight windows of twenty-four rows each, plus one block of eight rows outside of the windows. Each of the eight blocks of twenty-four rows provides storage for one of the eight register windows of the circular stack in FIG. 4. The single block of eight rows provides the physical storage for the eight global registers 4, also shown at the center of the circular stack in FIG. 4.

The twenty-four rows of thirty-two bit memory locations in each window of FIG. 6 provide the physical storage for the eight "out", eight "in" and eight "local" registers comprising each window of the circular stack in FIG. 4. The twenty-four rows of memory locations in each window are indicated by the brackets in FIG. 6. The first eight rows of Window Zero provide the physical storage for its "out" registers 33. The next eight rows of Window Zero provide the physical storage for its "local" registers 35. The third set of eight rows of Window Zero provide storage for its "in" registers 37.

Thus, as shown in FIG. 6, Rows Zero through Sixteen of RAM Array 24 provide storage for Window Zero 6. Likewise, Rows Sixteen through Thirty-nine provide storage for Window One 8, and Rows One hundred twelve through one hundred twenty-seven and Rows Zero through seven provide storage for Window Seven 20.

Each window is comprised of the same registers (i.e. r[8]-r[31]), but each of the eight windows represents a unique mapping of those registers onto a different block of physical memory locations in RAM Array 24. Typically, the CPU's registers are numbered according to a convention such as the one defined in FIG. 3. Each register occupies a fixed position in the windows regardless of which window is currently active. The registers' fixed positions are each defined by a unique five bit address. Thus, r[8] is always the first register in every window, the decoded value of its five bit address equal to zero. The last register in every window is r[31], the decoded value of its five bit address equal to twenty-three. When the CPU accesses a particular window register, it does so by issuing the five bit address, unique to that register, to the Decode Logic 22 via the ADDR-A 30, ADDR-B 32 or ADDR-R 34 inputs. The mapping of that register to a particular memory location in the array is completely transparent to the CPU.

The mapping of the CPU registers to different blocks of memory locations in RAM Array 24 is accomplished by CWP 28. The decoded value of CWP 28 corresponds to the number of the currently active window. Further, the decoded value of CWP 28, because it forms the three most significant bits of the RAM Array address, effectively points Decode Logic 22 to the first physical memory location contained in the block of memory locations allocated to provide storage for that window. Thus, if the decoded value of CWP 28 is seven, the current window is Window Seven and Decode Logic 22 is effectively pointed to Row One Hundred twelve of RAM Array 24. The five bit register address supplied by the CPU provides the five least significant bits of the eight bit RAM Array address. Thus, the five bit register address serves to index the pointer, from zero to twenty-three rows relative to the first row of the block, as determined by the value of CWP.

Thus if the decoded value of CWP is seven, and the CPU wishes to access r[8], the decoded value of CWP 28 points Decode Logic 22 to Row One hundred twelve and the CPU issues a five bit address to the ADDR-A 30 (or ADDR-B 32) inputs, the decoded value of which is zero. The Decode Logic 22 pointer is moved zero rows and thus, the Wordline-A 36 (or Wordline-B 38) connected to Row One hundred twelve is activated, accessing the data stored there. The data stored in row one hundred twelve of RAM Array 24 thereby appears on OPERAND-A 42 (or OPERAND-B 44). If the active window remains Window Seven, and the CPU wishes to access data stored in r[31], the CPU will issue the unique address of r[31] to the ADDR-B 32 (or ADDR-A 30)inputs, the decoded value of which is twenty-three. The Decode Logic 22 pointer is indexed twenty-three rows from Row One hundred twelve to Row Seven, the last row in Window Seven. The Wordline-B 38 (or Wordline-A 36) connected to Row Seven is activated, causing the data stored in Row Seven of RAM Array 24 to become available on OPERAND-B 44 (or OPERAND-A 42). Thus, Row Seven provides physical storage for r[31] as long as the currently active window is Window Seven.

If the current window pointer CWP 28 were incremented by one, the decoded value of CWP would be zero. This would cause the Decode Logic 22 to point to Row Zero of RAM Array 24. If the CPU wished to store new data in r[31], it would issue the register's five bit address, with a decoded value of twenty-three to the ADDR-R 34 inputs. The Decode Logic 22 pointer would again be indexed by twenty-three rows, and would point to Row Twenty-three of RAM Array 24. The Decode Logic 22 would then activate the Wordline-R 40 which connects to Row Twenty-three, causing data present on RESULT 26 to be stored into row twenty-three. Thus, Row Twenty-three provides physical storage for r[31] while the currently active window is Window Zero.

The method by which the sharing of the "in" and "out" registers is effectuated can be observed with reference to FIG. 6. By overlapping the blocks of memory allocated to each window, the physical storage for the "out" registers of Window One 8 is provided by the same row of memory locations that provide storage for the "in" registers 37 of Window Zero 6. Thus, the eight bit address for the "in" register r[24] of Window One 6 (the CWP for Window Zero plus the five bit address unique to all r[24]'s), decodes to access the same physical memory location as the eight bit address for the "out" register r[8] of Window One 8 (the CWP for Window One plus the five bit address unique to all r[8]'s). If Window One is active, and the CPU addresses r[8], it will obtain the same data as it would if Window Zero were active and the CPU had addressed r[24]. In other words, both eight bit addresses, when decoded, activate the same Wordline A, Wordline B or Wordline R.

Figure 7:
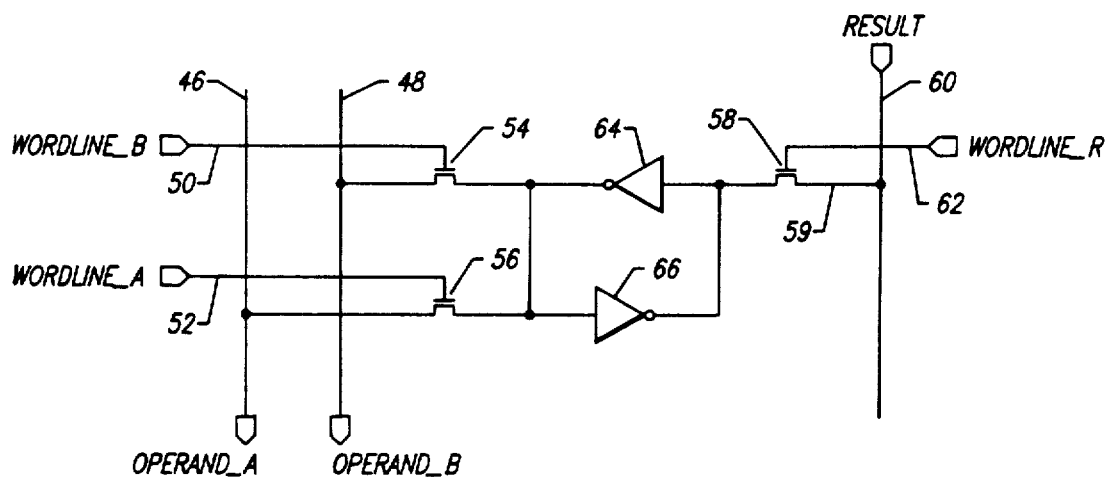
FIG. 7 depicts a prior art three port RAM bit cell.

FIG. 7 illustrates a single three-port RAM cell which is contained within the conventional RAM Array 24 shown in FIGS. 5 and 6. Each row of the RAM Array 24 contains thirty-two of these RAM bit cells, and each RAM bit cell stores one bit of information. Every RAM bit cell in a particular row is coupled to the same Wordline-A 36 (FIG. 5) at its Wordline-A 52 input. An active Wordline-A 36 (FIG. 5) turns on the transmission gate 56 of each RAM bit cell in the selected row. The bit of data stored in the inverters 64, 66 (i.e. the latch) of each cell in the selected row is thereby transmitted to each cell's output port Operand-A 46. Likewise, every Ram bit cell in a particular row is coupled to the same Wordline-B 38 (FIG. 5) at its Wordline-B 50 input. An active Wordline-B 38 (FIG. 5) turns on the transmission gate 54 of each RAM bit cell in a given row. The stored bit of data in the latch 64, 66 of each cell in the selected row is transmitted to each cell's output port Operand-B 48. Finally, every RAM bit cell is coupled to the same Wordline-R 40 (FIG. 5) at its Wordline-R 62 input. An active Wordline-R 40 (FIG. 5) turns on the transmission gate 58 of each cell in the selected row and connects the bit of data on Result lines 60 to the inputs 59 of each RAM cell in the selected row. For each additional input or output port, an additional transmission gate must be added to the conventional RAM bit cell. Further, the memory cell inverters 64 and 66 would have to be enlarged to compensate for any such additions.

The total time required to obtain an operand from the prior art register file can be divided into two parts; the decode time and the read time. When the eight bits of address (the three bit CWP plus the five bit register address) arrive at the register file, the address is decoded by the Decode Logic Circuit 22 to select the particular word select line (i.e. Wordline-A 36, Wordline-B 38 or Wordline-R 40) to be activated. After the appropriate wordline has been activated, the contents of the selected row of the RAM Array 24 is read from the RAM Array 24 via the corresponding thirty-two bit operand output bus; OPERAND-A 42 or OPERAND-B 44.

II. PREFERRED EMBODIMENT OF THE INVENTION

Figure 8:
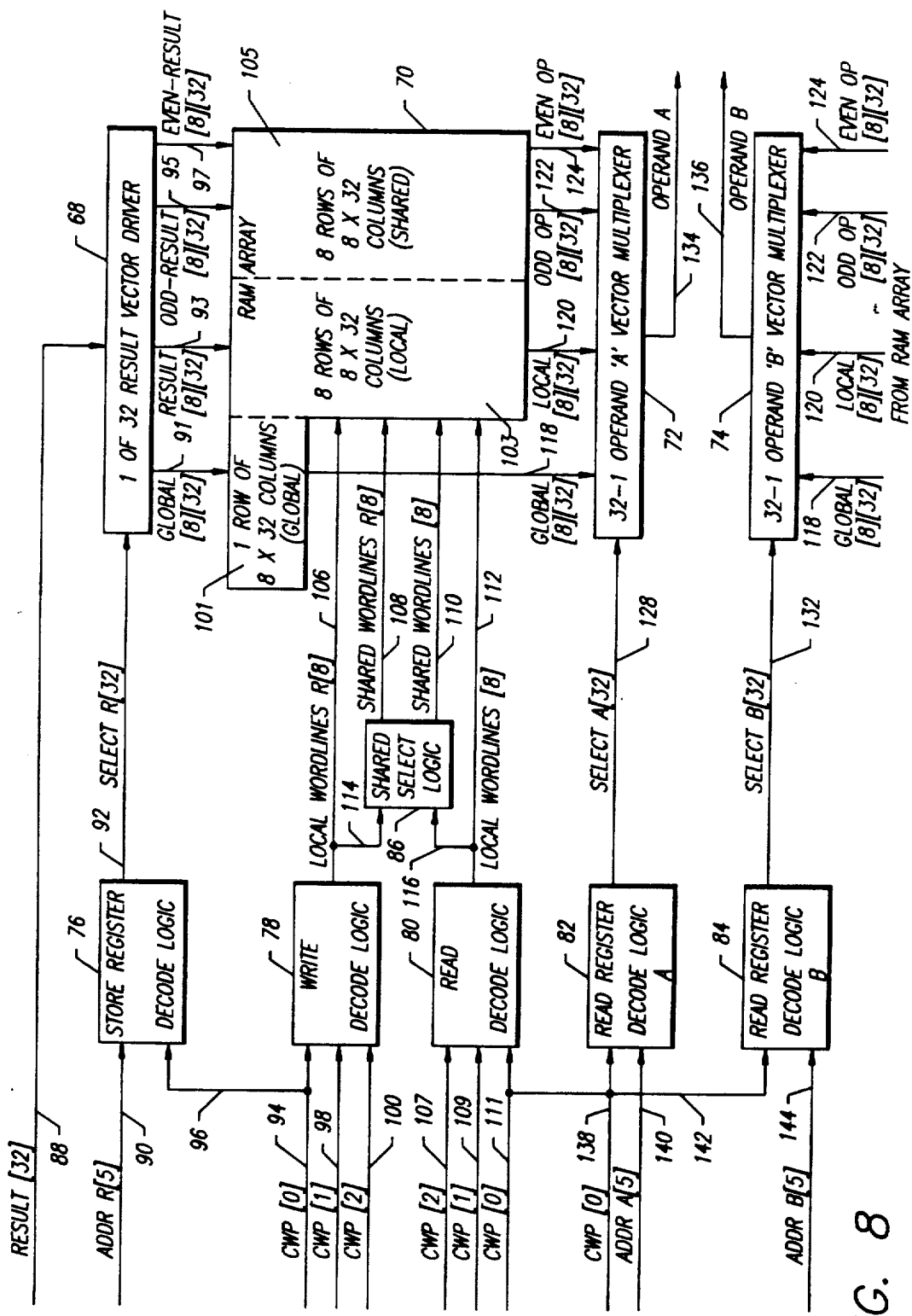
FIG. 8 depicts a register file implementation in accordance with the present invention.

Referring to FIG. 8, a block diagram representation of the preferred embodiment of the register file incorporating the present invention is shown. The preferred embodiment incorporates the following components including a RAM Array 70, a Result Vector Driver 68, Operand Vector Multiplexers 72 and 74, a Store Register Decode Logic circuit 76, Write Decode Logic circuit 78, a Read Decode Logic circuit 80, Read Register Decode Logic circuits 82 and 84 and a Shared Select Logic circuit 86, each of which will be discussed in more detail shortly.

Referring to the top portion of FIG. 8, the Result Vector Driver 68 receives two types of inputs over input buses 88 and 92. RESULT Input 88 is a thirty-two bit bus over which a thirty-two bit result of an operation performed by the CPU is input to the Result Vector Driver 68. Select-R input bus 92 is a set of thirty-two selection signals labeled Select-R 92. The Result Vector Driver 68 has a total of 1,024 output bit lines which are input into RAM Array 70. These lines comprise the data inputs for all of the memory locations which are addressable within the currently active register window. The inputs into the RAM Array 70 are labeled according to the four types of registers for which the corresponding memory locations are providing storage: "Global" registers - eight, thirty-two bit vector inputs 91, "Local" registers - eight, thirty-two bit vector inputs 93, "Odd-Result" inputs (for "out" registers if the active window is odd-numbered, otherwise for "in" registers) - eight, thirty-two bit vector inputs 95 and "Even-Result" inputs (for "out" registers if the active window is even-numbered, otherwise for "in" registers) - eight, thirty-two bit vector inputs 97. The Result Vector Driver 68 takes incoming results data over thirty-two bit bus RESULT 88 and, in accordance with the one active Select R 92 line out of thirty-two, transmits the data to the appropriate thirty-two bit vector which form the inputs to the one of thirty-two memory locations in the current window of RAM Array 70 which is to have the result stored within it. Store Register Decode Logic Circuit 76 activates the appropriate Select-R signal 92 in accordance with the five bit register address input ADDR-R 90.

In the preferred embodiment, the RAM Array 70 is a three part matrix of RAM bit cells for storing Global operands, Local operands and Shared operands (i.e. "In" and "Out" operands) for a particular window. The Global operands for all windows are stored in Global portion 101 as a single row of eight, thirty-two bit memory locations (two hundred fifty-six bits). The Local operands are stored in the Local portion 103 as eight rows of eight, thirty-two bit memory locations. The Shared operands are stored in Shared portion 105 in the form of eight rows of eight, thirty-two bit memory locations. The preferred embodiment of the Shared portion 105 of RAM Array 70 is designed with an architecture that permits the access of two rows of memory locations simultaneously, thus providing access to both the "In" and "Out" registers from Shared portion 105 of the array. The preferred embodiment of the memory architecture of the RAM Array 70 will be discussed later with reference to FIGS. 9, 10 and 11.

In addition to the four groups of two hundred fifty-six inputs 91, 93, 95 and 97 from the Result Vector Driver 68, the RAM Array 70 also has thirty-two additional inputs which are grouped into four classes: Local-Wordlines-R 106, Shared-Wordlines-R 108, Shared-Wordlines 110 and Local-Wordlines 112. The Local-Wordlines-R 106 are generated by the Write Decode Logic circuit 78 and the eight Local-Wordlines 112 are generated by the Read Decode Logic circuit 80. Each one of the eight Local-Wordlines-R 106 and Local Wordlines 112 is connected to one of the eight rows of thirty-two bit memory locations located in the Local portion 103 of the RAM Array 70. Each one of the eight Shared-Wordlines-R 108 and Shared-Wordlines 110 is coupled to one of the eight rows of thirty-two bit memory locations in the Shared portion 105 of the RAM Array 70.

To accomplish the simultaneous access of two rows of memory locations from the Shared portion 105 of RAM Array 70, a strategy activating those rows of memory locations is logically implemented by the Shared Select Logic circuit 86. This circuit supplies the activating signals called Shared- Wordlines-R 108 and Shared-Wordlines 110. The inputs to the Shared Select Logic circuit 108 are the Local Wordlines-R 106 input over eight lines 114, and the Local-Wordlines 112 input over eight lines 116. The Shared Select Logic circuit 86 will be explained later with reference to FIG. 11.

RAM Array 70 has a total of 1,024 output bit lines which are input into Operand Vector Multiplexers A 72 and B 74. These lines comprise the data outputs for all of the memory locations which are addressable within the currently active register window. The inputs into Vector Multiplexers 72, 74 are labeled according to the four types of registers for which the corresponding memory locations are providing storage: "Global" registers - eight, thirty-two bit vector inputs 118, "Local" registers - eight, thirty-two bit vector inputs 120, "ODD-OP" (for "out" registers if the active window is odd-numbered, otherwise for "in" registers) - eight, thirty-two bit vector inputs 122, "EVEN-OP" (for "out" registers if the active window is even-numbered, otherwise for "in" registers) - eight, thirty-two bit vector inputs 124. The Operand Vector Multiplexers 72, 74 select one of the thirty-two vectors of input data and pass that vector to their respective outputs ports Operand-A 134 or Operand-B 136. The particular Vector is selected in accordance with the one of thirty-two Select-A 128 or Select-B 132 lines which is activated by the Read Register Decode Logic A 82 or B 84 respectively. The one of thirty-two Select lines is activated in accordance with the decoded value of the address of the particular register to be accessed, as presented by the CPU on either ADDR-A 140 or B 144. Thus, the thirty-two bit vector of data selected to be passed through either of the Vector Multiplexers 72, 74 corresponds to the thirty-two bit operand stored in the physical memory location currently assigned to provide storage for the accessed register. The CPU controls on which output port (i.e. Operand-A 134 or B 136) the data is made available by choosing on which address bus (i.e. ADDR-A 140 or B 144) it presents the address of the register to be accessed.

As with the prior art embodiment, when the CPU reads operand data from or writes operand data to its registers in the register file, it is actually reading from or writing to those physical memory locations onto which the registers are currently mapped: those memory locations in the currently active window. The mapping of registers to specific memory locations is accomplished by convention according to the decoded value of CWP. In the preferred embodiment of the present invention, all of the physical memory locations assigned to a particular window are accessed simultaneously when the current decoded value of CWP corresponds to that particular window. Memory locations are accessed when the data stored in each of their thirty-two RAM bit cells is transmitted to their outputs, or their inputs are made amenable to receiving new data.

The convention adopted in the preferred embodiment of the invention is such that when the decoded value of CWP is zero (i.e. 000 binary), the current window will be Window Zero. Likewise, when the decoded value of CWP is seven (i.e. 111 binary), the current window will be Window Seven. The CWP is input into the Write Decode Logic 78 at inputs 94, 98 and 100. The CWP is also input into the Read Decode Logic 80 at inputs 107, 109 and 111. For the decoded value of CWP equal to zero, the inputs to the Write Decode Logic would be zero (94), zero (98), zero (100), and the inputs to the Read Decode Logic would be zero (107), zero (109), zero (111).

The convention further requires that when the decoded value of CWP is zero, the Write Decode Logic block will activate the Local-Wordline-R 106, which is coupled to the first row (Row Zero) of memory cells in the Local portion 103 of RAM Array 70. The Read Decode Logic will likewise activate the Local-Wordline 112 which is also coupled to Row Zero of the Local portion of RAM Array 70. These two active lines are also input to the Shared Select Logic 86 by buses 114 and 116. As a result of the logical operation performed on these inputs by the Shared Select Logic, the Shared-Wordline-R 108 coupled to Row Zero of the Shared portion 105 of the RAM Array 70 is activated. Additionally, the Shared-Wordline-R 108 coupled to Row One of the Shared portion of the RAM Array is also activated. By the same logic, the Shared-Wordlines 110 coupled to Rows Zero and One of the Shared portion 105 of the RAM Array 70 are also activated. Following this convention, if the decoded value of CWP is equal to one (Window One active), Row One of the Local portion 103 is activated along with Rows One and Two of the Shared portion 105. If the decoded value of CWP equals seven (Window Seven active), Row Seven in both the Local and Shared portions of RAM 70 are activated, along with Row Zero in the Shared portion. These rows are activated by the appropriate logic signals in the same manner as described above for the decoded value of CWP equal to zero.

Thus, three rows of eight, thirty-two bit memory locations (one row in Local portion 103 and two rows in Shared portion 105) are always accessed and thereby allocated to the currently active window to provide storage for its twenty-four window registers. For Window Zero, the accessed Row Zero of the Local portion 103 of RAM Array 70 provides the physical storage for Window Zero's eight "local" registers. Accessed Row Zero of the Shared portion 105 of RAM Array 70 provides the physical storage for Window Zero's eight "out" registers. Accessed Row One of the Shared portion 105 of RAM Array 70 provides the physical storage for Window Zero's eight "in" registers. Window Zero is now "open", with the contents of its twenty-four assigned memory locations available over the RAM Array output lines Local 120, ODD-OP 122 and EVEN-OP 124. Further, Window Zero's twenty-four memory locations are all amenable to receiving and storing data presented to them on input lines Local 93, ODD-RESULT 95 and EVEN-RESULT 97.

The single row of eight memory locations of the Global portion 101 of RAM Array 70 provide physical storage for the register file's global registers. Because global registers are available to all procedures in a program, they must be accessible independent of which window is currently active; they are accessible independent of the value of CWP. Thus, the single row of eight memory locations of the Global portion 101 are always active; they are always amenable to receiving data for storage from inputs Global 91 and their stored data is always present on output lines Global 118.

There are two hundred fifty-six Global 118 outputs, which correspond to the eight, thirty-two bit memory locations assigned to the global registers, and which form inputs to the Operand Vector Multiplexers. Likewise, there are two hundred fifty-six each of the Local 120, ODD-Op 122, and EVEN-Op 124 outputs, which form inputs to the Operand Vector Multiplexers. This corresponds to the eight, thirty-two bit memory locations assigned to the local, and the sixteen, thirty-two bit memory locations assigned to the shared ("in" and "out") registers. Each output line corresponds to one bit of a memory location. This same distribution applies to the Global 91, Local 93, ODD-RESULT 95 and EVEN-RESULT 97 lines which are output from the Result Vector Driver 68 and input to RAM Array 70. The Operand Vector Multiplexers and the Result Vector Driver group these lines together into vectors of thirty-two lines, each vector corresponding to the bit locations of one thirty-two bit memory location. Operand Vector Multiplexers A 72 and B 74 selectively pass one of the thirty-two, thirty-two bit vectors from their inputs to their thirty-two bit outputs: Operand-A 134 and Operand-B 136. Result Vector Driver 68 performs the inverse function. It takes data present on its thirty-two bit RESULT input 88 and passes it through to one of thirty-two, thirty-two bit vectors forming the inputs to the currently accessed memory locations of RAM Array 70.

When the CPU wants to read operand data from one of its thirty-two registers, it presents that register's unique five bit address to either Read Register Decode Logic A 82 or B 84 via ADDR-A 140 or B 144 respectively. The logic block receiving the address will decode it, and activate the appropriate Select-A 128 or B 132 line corresponding to that address. The activated Select line (Select-A 128 or Select-B 132) will then cause the data present on the thirty-two bit vector, the lines of which emanate from the memory location in RAM Array 70 currently assigned to that register, to be connected to the output of Vector Multiplexer A 72 or B 74. The CPU may then avail itself of that data as presented on either output Operand-A 134 or B 136.

Likewise, to store data to one of its registers, the CPU simply presents the unique five bit address of that register to the Store Register Decode Logic 76, which activates the appropriate one of thirty-two Select-R 92 lines, which passes the new data present on Result 88 to the corresponding one of thirty-two, thirty-two bit vectors, the lines of which form the inputs to the memory location of RAM Array which is currently assigned to that register. The mapping of its registers onto particular memory locations is completely transparent to the CPU.

Thus, the method and architecture of the preferred embodiment limits the CPU register access time to the time required by the Decode Logic Blocks 82, 84 and 76 to decode the unique five bit register address, plus the time required for the vector signals to be selected and passed through Vector Multiplexers A 72, B 74 or Vector Driver 68. All of the memory locations assigned to provide storage for the registers under the current window were accessed from the RAM Array 70 according to the value of CWP, and CWP was available sufficiently early to permit the complete accessing of these locations prior to the CPU's need to address its registers. Further, this architecture may provide simultaneously access to virtually any number of registers without increasing the access time. This is possible because the architecture of the preferred embodiment permits parallel access to all of the registers in the window. A circuit designer can simply provide one additional Operand Vector Multiplexer (or Result Vector Driver) and an associated Read (or Store) Register Decode Logic circuit for every additional operand to be accessed. Obviously, the number of simultaneously accessible registers will be balanced against the cost of increased circuit size, but the decision can be made virtually independent of any impact on access time.

Figure 9:
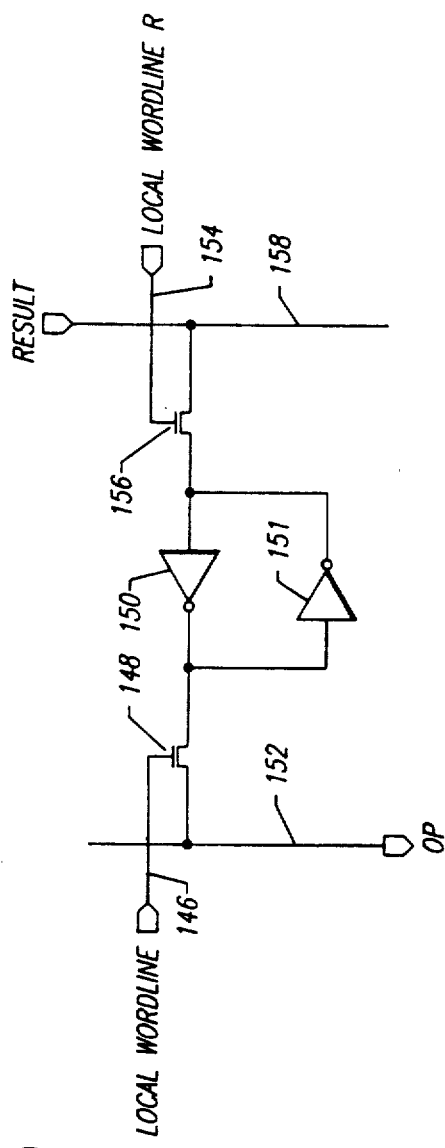
FIG. 9 depicts a "local" RAM bit cell in accordance with the present invention.
Figure 11A:
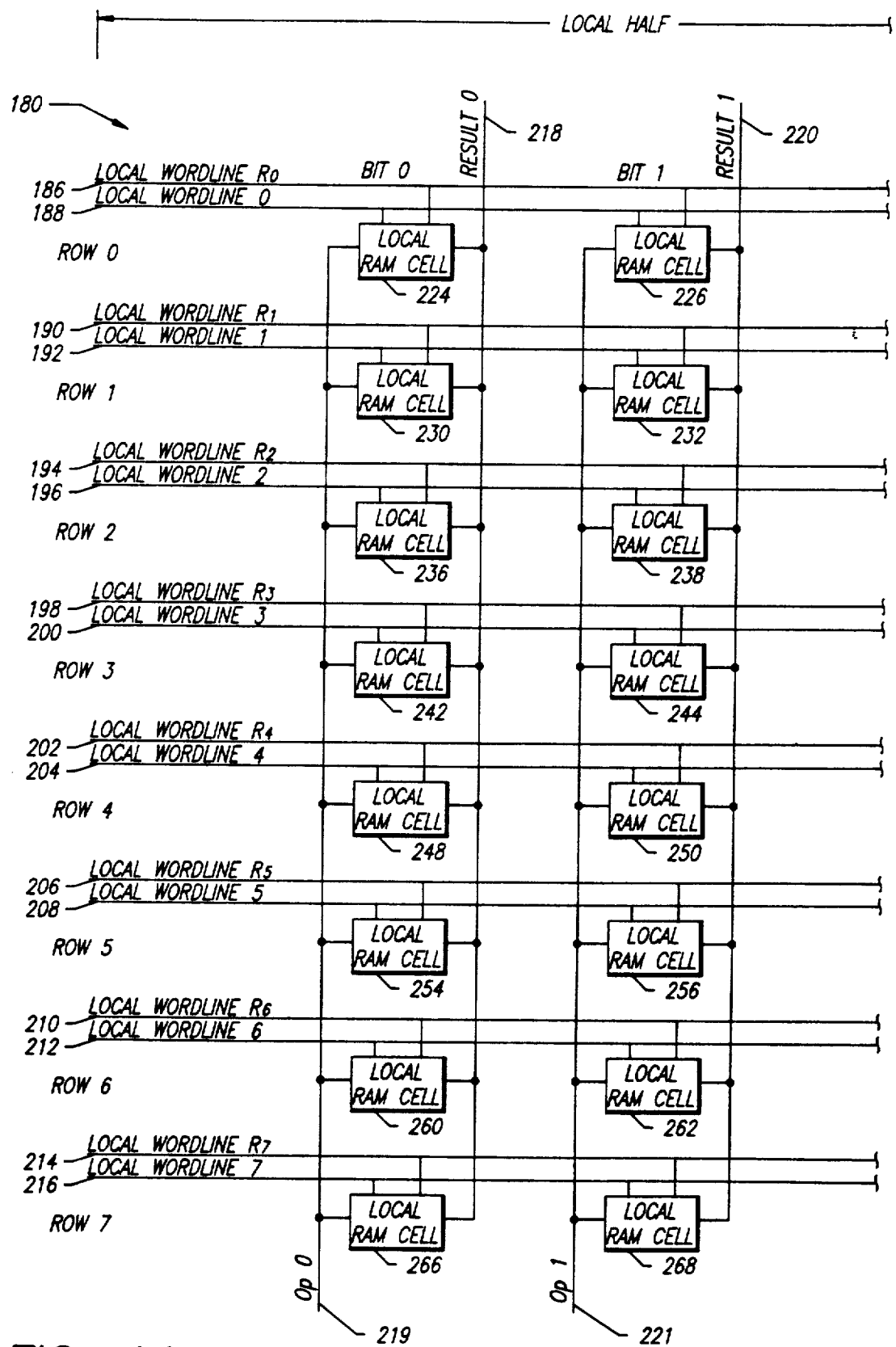
FIG. 11a-11c a detailed schematic diagram of a RAM Array, as shown in FIG. 8, in accordance with the present invention.
Figure 11B:
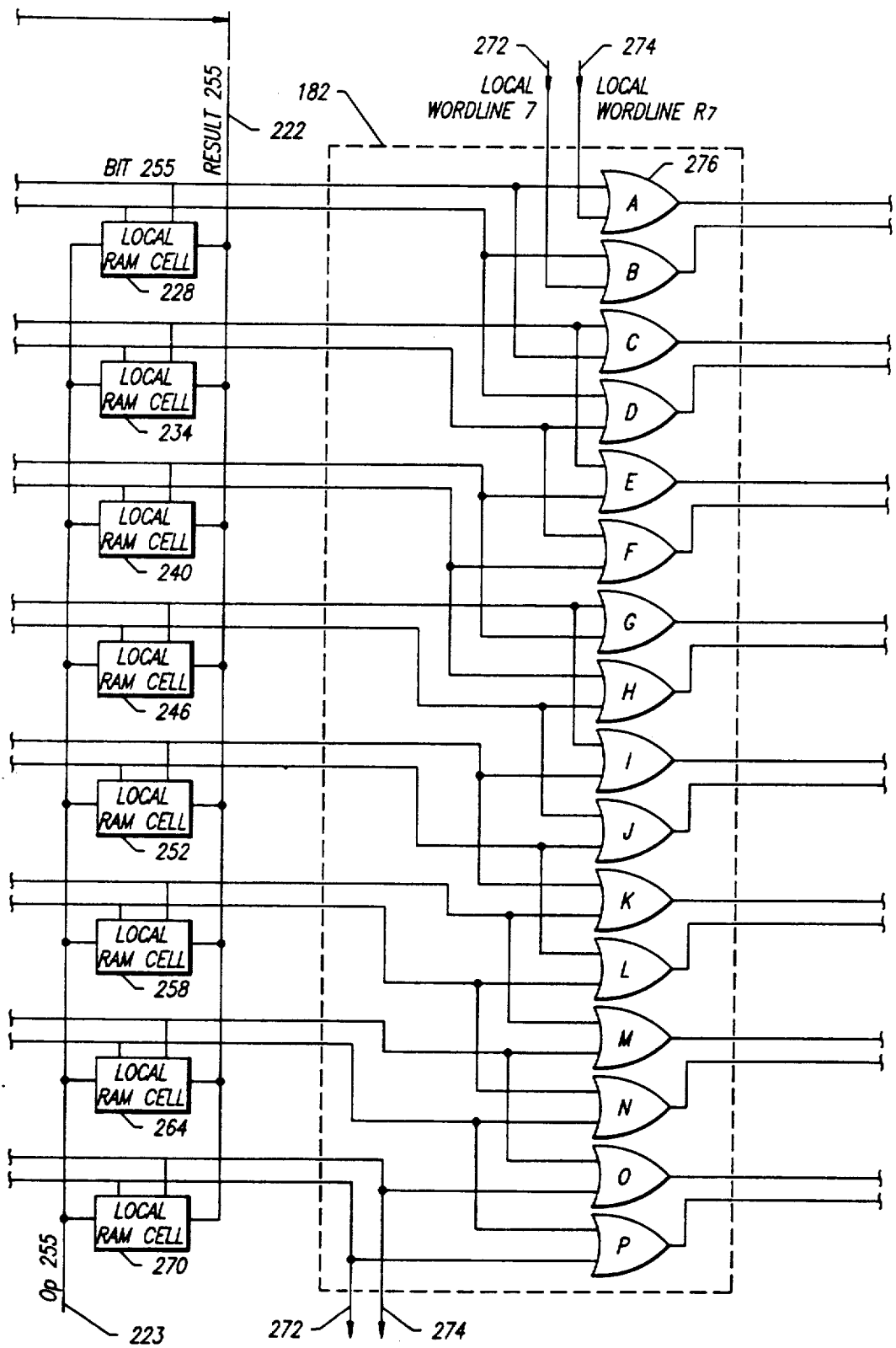
Figure 11C:
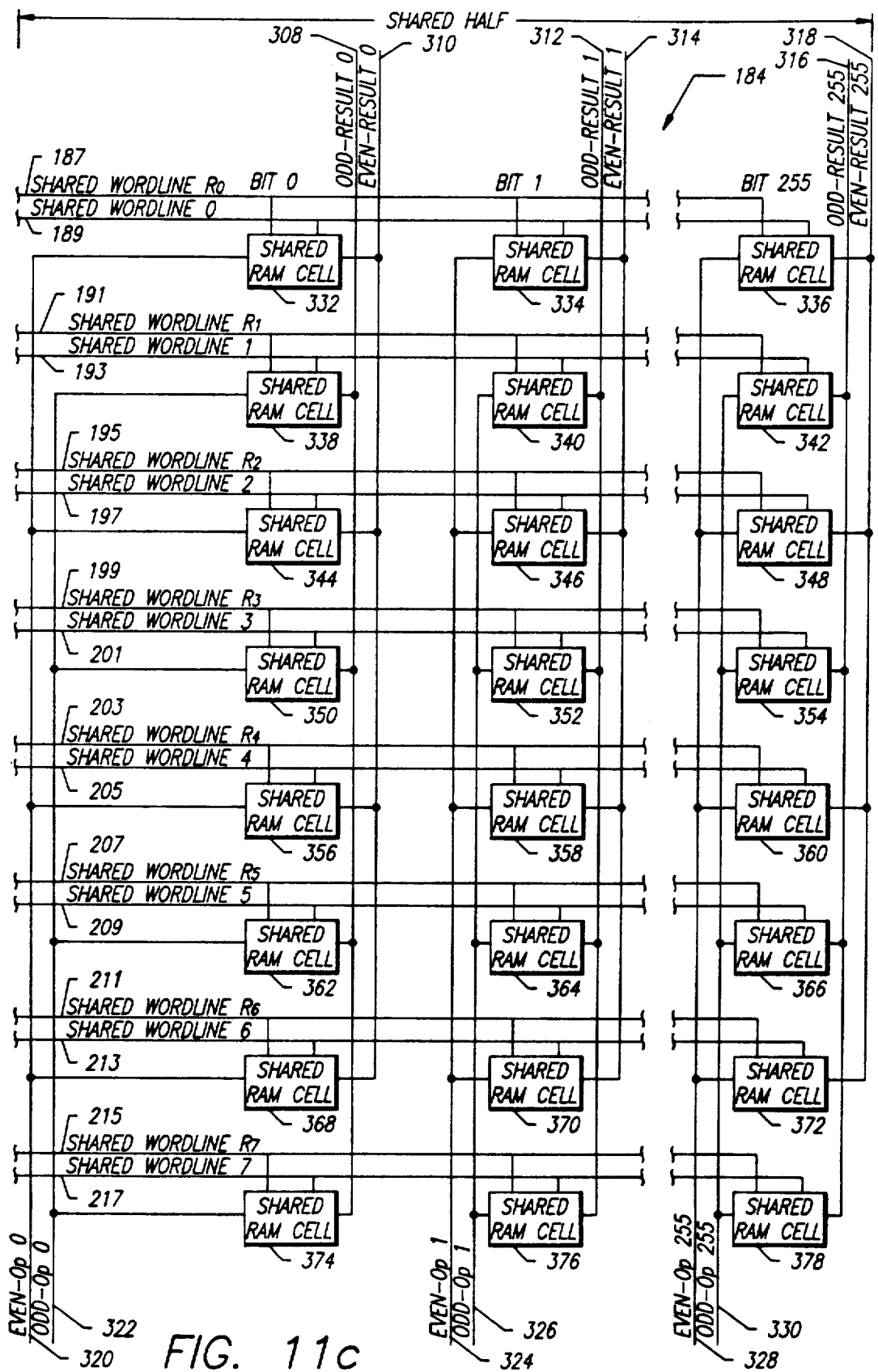

The Local portion 103 and the Global portion 101 of the RAM Array 70 contain identical single port RAM bit cells for storing operand data. The single port "Local" RAM bit cell is depicted in FIG. 9. Each memory location of the Global portion 101 and the Local portion 103 of the RAM Array 70 is comprised of thirty-two "Local" RAM bit cells for storing the thirty-two bits of an operand. The Global portion 101 of the RAM Array 70 has a single row of two hundred and fifty-six single port RAM bit cells and the Local portion 103 of the RAM Array 70 has eight rows of two hundred and fifty-six single port RAM bit cells. Thus, each row contains sufficient RAM bit cells for eight memory locations. The eight rows of RAM bit cells located in the Local portion 103 of the RAM Array 70 are depicted in FIG. 11.

Referring to FIG. 9, a more detailed discussion of the preferred embodiment of the Local RAM bit cell is now presented. Local-Wordline 146 provides a signal to pass gate 148 which, when active, connects the output of memory latch 150, 151 to the Operand Output Line (OP) 152, thereby permitting access to the bit of operand data stored in the "Local" RAM bit cell. The Local-Wordlines 146 for each RAM bit cell in a given row are coupled together, and are then coupled to one of the eight Local-Wordlines (112, FIG. 8) which are input in the RAM Array (70, FIG. 8). When Wordline-R 154 becomes active, the pass gate 156 is activated and the operand data on the Result line 158 is connected to the input of the memory latch 150, 151, thereby storing the operand data bit. The Local Wordlines-R 154 for each RAM bit cell in a given row are coupled together, and are then coupled to one of the eight Local-Wordlines-R (106, FIG. 8) input into RAM Array (70, FIG. 8). In sum, the Local-Wordline input 146 reads data from the RAM bit cell when active, and the Local-Wordline-R 154 writes data into the RAM bit cell when active. Therefore, when a Local-Wordline (112, FIG. 8) becomes active, data is read from all two hundred fifty-six RAM bit cells in that row. When a Local-Wordline-R (106, FIG. 8) become active, data is written into all two hundred fifty-six RAM bit cells in that row. The Operand Output Lines 152 for each of the two hundred fifty-six RAM bit cells in the single row of Global portion 101 correspond to the two hundred fifty-six Global outputs 118 (FIG. 8). The Operand Output Lines 152 for each of the two hundred fifty-six RAM bit cells in each of the eight rows in Local portion 103 correspond to the two hundred fifty-six Local outputs 120 (FIG. 8). Likewise, the Result Lines 158 for each RAM bit cell in the Global portion and Local portion correspond to the Global 91 and Local 92 inputs to RAM Array 70 (FIG. 8).

Figure 10:
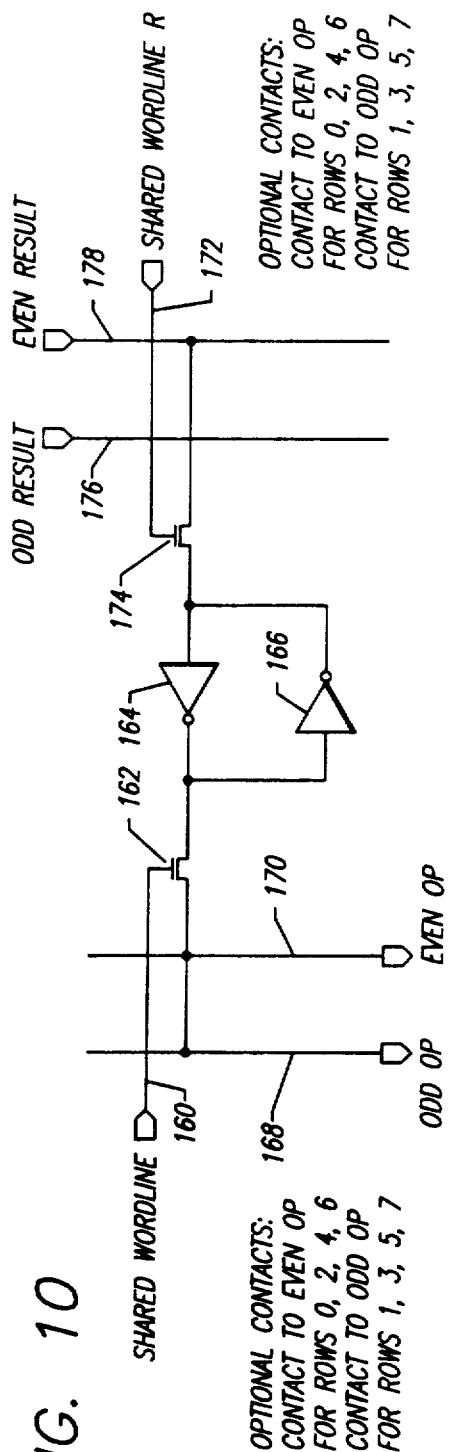
FIG. 10 depicts a "shared" RAM bit cell in accordance with the present invention.

Referring now to FIG. 10, a detailed description of a Shared RAM bit cell for the Shared portion (105, FIG. 8) of the RAM Array (70, FIG. 8) is now discussed. As in the case of the Local RAM bit cells (FIG. 9), there are eight rows of two hundred and fifty-six RAM bit cells in the Shared portion 105 of the RAM Array 70. Shared-Wordline 160 activates pass gate 162 to connect an operand data bit from the latch 164, 166 to either ODD-OP line 168 or EVEN-OP line 170. The data bit is output over the Even Operand Output Line 170 (EVEN-OP) when the RAM bit cell is in an even-numbered row (i.e. Rows 0, 2, 4, 6) of the Shared portion (105, FIG. 8) of the RAM Array (70, FIG. 8). If the RAM bit cell is in an odd-numbered row (i.e. Rows 1, 3, 5, 7) of the Shared portion (105, FIG. 8) of the RAM Array (70, FIG. 8), then the operand data bit is output over the Odd Operand Output Line (ODD-OP) 168. The Shared-Wordlines 160 for each RAM bit cell in a given row are coupled together, and are then coupled to one of eight Shared-Wordlines 110 which are output from the Shared Select Logic circuit (86, FIG. 8).

Shared-Wordline-R 172 activates pass gate 174, connecting either ODD-RESULT 176 or EVEN-RESULT 178 to the input of the latch 164, 166 to store data. The operand data bit stored in the latch 164, 166 is obtained from the Odd Result Input Line (ODD-RESULT) 176 if the RAM bit cell is located in an odd-numbered row (i.e. Rows 1, 3, 5, 7). Alternatively, the operand data bit is obtained from the Even Result Input (EVEN-OP) 178 if the RAM bit cell is located in an even-numbered row (i.e. Rows 0, 2, 4, 6). The Shared-Wordlines-R 172 for each RAM bit cell in a given row are coupled together, and are then coupled to one of the eight Shared-Wordlines-R 108, which are output from the Shared Select Logic circuit (86, FIG. 8). The EVEN-OP lines 170 and the ODD-OP lines 168 for each shared RAM bit cell corresponds to the EVEN-OP (124, FIG. 8) and ODD-OP (122, FIG. 8) outputs from the RAM Array (70, FIG. 8). Likewise, the EVEN-RESULT 178 and ODD-RESULT 176 inputs to each shared RAM bit cell corresponds to the EVEN-RESULT (97, FIG. 8) and ODD-RESULT (95, FIG. 8) inputs to the RAM Array (70, FIG. 8).

The Local and Shared portions of the RAM Array (70, FIG. 8) are now described in more detail with reference to FIG. 11. FIG. 11 illustrates that the Local and Shared RAM bit cells of the RAM Array are arranged in a matrix configuration (the Global registers in the Global portion 101 of the RAM Array 70 are not shown in FIG. 11). The Local portion (103, FIG. 8) of the RAM Array (70, FIG. 8) is shown in FIG. 11 as the left-hand portion or Local Half 180 of the RAM Array. The Shared Select Logic circuit (86, FIG. 8) is depicted as a circuit in the center portion 182 of the RAM Array and is comprised of Or gates 276 (A-P). The shared portion (105, FIG. 8) of the RAM Array (70, FIG. 8) is depicted as the right-hand side or Shared Half 184 of the RAM Array (FIG. 11). From the Write Decode Logic circuit (78, FIG. 8), eight Local-Wordlines-R 186, 190, 194, 198, 202, 206, 210 and 214 are provided to the RAM Array. The Local-Wordlines-R are provided to the Shared Logic Circuit 182 and then output as Shared-Wordlines-R 187, 191, 195, 199, 203, 207, 211 and 215 respectively. The Read Decode Logic circuit (80, FIG. 8) provides eight Local-Wordlines 188, 192, 196, 200, 204, 208, 212 and 216, input into the Local Half 180 of the RAM Array. The Local-Wordlines are input into the Shared Select Logic circuitry 182 and then output as Shared-Wordlines 189, 193, 197, 201, 205, 209, 213 and 217 respectively. Each Local Wordline-R and Local-Wordline are coupled to a unique row in the Local Half 180 and are connected in common with each of the RAM bit cells in that Row. Referring to Row Zero, the Local-Wordline-R Zero 186 and the Local-Wordline Zero 188 are both connected to each of the row's two hundred fifty-six RAM bit cells, three of which are shown and labeled as 224, 226 and 228. Local-Wordline-R Zero 186 is connected to each of its cells at the Local-Wordline-R (158, FIG. 9) of each individual cell. The Local-Wordline Zero 188 is connected to each of the Row Zero cells at the Local-Wordline input (146, FIG. 9) of each individual cell.

The corresponding Shared-Wordline-R Zero 187 and Shared-Wordline Zero 189 coupled to Row Zero of the Shared Half 184 are also connected to the row's two hundred and fifty-six Shared RAM bit cells, three of which are depicted and labeled as 332, 334 and 336. Shared-Wordline-R Zero 187 is connected to each of its cells at the Shared-Wordline-R input (172, FIG. 10) of each individual cell. Shared-Wordline Zero 189 is connected to each of Row Zero's cells at the Shared-Wordline input (160, FIG. 10) of each individual cell. Each of the other rows are similarly connected.

Each of the RAM bit cells located in the same column of the Local Half 180 of the RAM Array is connected to the same Operand Output line. For example, all eight RAM bit cells (224, 230, 236, 242, 248, 254, 260 and 266) in Column Zero are connected to the Operand Output line (Op Zero) 219. All eight RAM bit cells in Column Zero are also connected to the same Result input line: RAM bit cells 224, 230, 236, 242, 248, 254, 260 and 266 are each connected to the Result Zero line 218. As noted earlier, each of the Operand output lines (i.e. Op Zero 219, Op One 221, etc. ) in Local Half 180 of the Array (FIG. 11), corresponds to one of the two hundred fifty-six Local outputs (120, FIG. 8).

Referring now to the Shared Half 184 (FIG. 11) of the RAM bit Array, note that each RAM cell is connected to either an Even Operand Output line or an Odd Operand Output line. Specifically, by convention, the RAM Bit cells 332, 344, 356, and 368 in Column Zero of the Shared Half are each connected to the Even Output Operand line (EVEN-OP Zero) 320 because each of these RAM bit cells are located in even-numbered rows of the RAM Array. Likewise, RAM bit cells 338, 350, 362 and 374 in Column Zero of the Shared Half are each connected to Odd Operand Output line (ODD-OP Zero) 322 because each of these RAM bit cells is located in an odd-numbered row of the RAM Array. By the same convention, each RAM bit cell in a given column of the Shared Half 184 of the RAM Array is also connected to either an Odd Result Input line or an Even Result Input line depending on whether the RAM bit cell is in an even or odd-numbered row. For example, the RAM cells 332, 344, 356 and 368 in Column Zero of the Shared Half are each coupled to Even Result Input line 310 because these RAM cells are located in the even-numbered rows of the RAM Array. Likewise, the RAM bit cells 338, 350, 362 and 374 in Column Zero are each coupled to the Odd Result Input line 308 because these RAM bit cells are each located in an odd-numbered row. As noted earlier, each of the two hundred fifty-six EVEN-OP lines in the Shared Half 184 of FIG. 11 correspond to the two hundred fifty-six EVEN-OP outputs (124, FIG. 8) of RAM Array 70 (FIG. 8). Likewise, the ODD-OP, EVEN-RESULT and ODD-RESULT lines (two hundred fifty-six each) of Shared Half 184 correspond to the ODD-OP (122, FIG. 8), EVEN-RESULT (97, FIG. 8) and ODD-RESULT (95, FIG. 8) lines respectively of the RAM Array (70, FIG. 8).

The purpose for this isolation of the inputs and outputs of even-numbered rows from the inputs and outputs of odd-numbered rows in the Shared Half 184 of the RAM Array is to permit access to two rows of memory locations simultaneously from the same half of the array. The Shared Half 184 must provide storage for sixteen shared registers for each window (both the eight "in" and eight "out" registers), whereas the Local Half 180 must only supply storage for eight local registers per window. The Shared Half 184 is able to provide storage for twice the number of registers as the Local Half 180, in spite of the fact that they have the same number of RAM bit cells, because the memory locations in the Shared Half are shared between adjacent windows. The row of memory locations assigned by convention to provide storage for the "in" registers of Window Zero is Row One. That same row is also assigned by convention to provide storage for the "out" registers of Window One. The "in" and "out" registers are shared between adjacent windows only (FIG. 4). The local registers are never shared, and therefore require a unique row of memory locations for each window. Thus, the Shared Half 184 provides storage for twice the number of registers as does the Local Half 180.

Now referring to the Shared Select Logic circuitry 182 of FIG. 11, note that each Local-Wordline-R and each Local-Wordline is directly coupled to two Or gates. In particular, referring to Local-Wordline-R Zero 186 (Row Zero), note that it is coupled to Or gate 276(A) and Or gate 276(C). Additionally, Local-Wordline 188 is connected to Or gate 276(B) and to Or gate 276(D). The Or gates enable the signal over the Local Wordline-R Zero 186 to be applied to two Shared-Wordlines-R 187 and 191. Likewise, the signal over Local-Wordline Zero 188 is applied to activate two Shared-Wordlines 189 and 193. This circuitry implements the logical strategy by which two rows in the Shared Half 184 of the RAM Array are always activated for every one row in the Local Half 180, thus providing physical storage for both "in" and "out" registers in the same Shared Half of the RAM Array. As discussed earlier, the row number which corresponds to the number of the currently active window provides storage for the "out" registers, and the next adjacent row provides storage for the "in" registers. The operation of the RAM Array (FIG. 11) in conjunction with the remaining portions of the circuitry of the register file (FIG. 8) is now discussed.

III. OPERATION OF THE PREFERRED EMBODIMENT

Referring to FIGS. 8 and 11, a detailed description of the operation of the preferred embodiment of the register file is now discussed. For purposes of this discussion, the RAM Array (70, FIG. 8) of the register file is assumed to be initialized with operands required for executing two procedures (e.g. procedures A and B). Assume that the CPU has already imported the necessary initial operands from the system's external memory for performing the routines associated with procedures A and B. When the CPU begins execution of the first procedure A, Window Zero (FIG. 4) is active as the decoded value of CWP is set to zero (000 binary). Thus, the CWP inputs (107, 109, 111 and 94, 98 and 100, FIG. 8) to the Read and Write Decode Logic circuits (78, 80, FIG. 8) are 000.

The value of the CWP is decoded by the Read Decode Logic circuit (80, FIG. 8) which activates the corresponding one of eight Local-Wordlines (112, FIG. 8). By the convention previously described, the Local-Wordline activated for a decoded CWP value of zero is Local-Wordline Zero (188, FIG. 11), coupled to Row Zero of the Local Half (180, FIG. 11) of the RAM Array. The Local-Wordline Zero (188, FIG. 11) is also input into the Shared Select Logic circuit (182, FIG. 11) which activates the Shared-Wordlines Zero and One (189, 193, FIG. 11), coupled to Rows Zero and One of the Shared Half (184, FIG. 11) of the RAM Array.

Likewise, the value of CWP is decoded by the Store Register Decode Logic circuit (76, FIG. 8) which activates the corresponding one of eight Local-Wordlines-R (106, FIG. 8). By the convention previously described, the Local-Wordline-R activated for a decoded CWP value of zero will be Local-Wordline R Zero (186, FIG. 11), coupled to Row Zero of the Local Half (180, FIG. 11) of the RAM Array. The Local-Wordline-R Zero (186, FIG. 11) is also input into the Shared Select Logic circuit (182, FIG. 11) which activates the Shared-Wordlines-R Zero and One (187, 191 FIG. 11), which are coupled to Row Zero and Row One of the Shared Half (184, FIG. 11) of the RAM Array.

The operation of the RAM Array is now discussed in more detail. The active Local-Wordline Zero 188 coupled to the Local RAM bit cells in Row Zero of the Local Half causes the data stored in all of Row Zero's two hundred fifty-six Local RAM bit cells (i.e. 224, 226, and 228, FIG. 11) to appear on each RAM cell's respective Operand Output (Op) lines (i.e. 219, 221 and 223, FIG. 11). The active Local-Wordline-R Zero 186 coupled to Row Zero's two hundred fifty-six Local RAM bit cells (i.e. 224, 226, and 228, FIG. 11) causes all of the cells in the row to become receptive to storing any new data present on each RAM cell's respective Result Input lines (i.e. 218, 220 and 222, FIG. 11). In this way, the eight, thirty-two bit memory locations in Row Zero (Local Half 180) have been assigned to provide physical storage for the CPU's eight local registers (r[16] to r[23]) whenever the active window is Window Zero. Thus, the eight memory locations virtually become the eight local registers; any data stored in the memory locations are local operands stored in that location's corresponding local register. By convention, the first thirty-two RAM cells of any active row in the Local Half of the RAM Array will provide storage for the first local register r[16], with each succeeding group of thirty-two RAM cells providing storage for the next register in numerical succession. Thus the last group of thirty-two RAM cells in any active row in Local Half 180, ending with RAM bit cell two hundred fifty-five (i.e. Cell 226, FIG. 11), provides storage for local register r[23].

Referring to FIG. 8, these eight local operands are made available at the inputs of the Operand Multiplexer A (72, FIG. 8) and simultaneously at the Operand Multiplexer B (74, FIG. 8) via the Local lines (120, FIG. 8). They could likewise be made available to virtually any number of Operand Multiplexers. New local operands are introduced to these memory locations by the Local outputs (93, FIG. 8) of Result Vector Driver (68, FIG. 8). It should be noted that additional Result Vector Drivers may be connected in parallel in precisely the same manner as provided for Result Vector Driver 68.

Referring back to FIG. 11, the Local-Wordline-Zero 188 also activates Or gate 276(B) and thereby activates its output, Shared Wordline Zero 189. This causes the data stored in all two hundred fifty-six Shared RAM bit cells (i.e. Cells 332, 334 and 336, FIG. 11) in Row Zero of the Shared Half 184 of the RAM Array to appear on the cells' respective Even Operand Output (EVEN-OP) lines (i.e. 320, 324 and 328, FIG. 11). Simultaneously, the Local-Wordline Zero 188 is also input into Or gate 276(D), which activates Shared-Wordline One 191, which in turn causes the data stored in the two hundred fifty-six Shared RAM bit cells (i.e. 338, 340 and 342, FIG. 11) to appear on their respective Odd Operand Output lines (i.e. 322, 326 and 330, FIG. 11). Further, Local-Wordline-R Zero 186 is input into Or gates 276 (A) and 276(C), which activate Shared-Wordline-R Zero 187 and Shared-Wordline-R One 191 respectively. The Shared RAM bit cells in Row Zero thereby become receptive to, and will therefore store, any new data presented to them on their Even Result Input lines (i.e. 310, 314 and 318, FIG. 11). The cells in Row One also thereby become receptive to data on their Odd Result Input lines (i.e. 308, 312 and 316, FIG. 11). In this way, the eight memory locations in Row Zero (Shared Half 184) are assigned to provide storage for the CPU's eight "out" registers (r[8] to r[15]), whenever the active window is Window Zero. Likewise, the eight memory locations in Row One (Shared Half 184) are assigned to provide storage for the CPU's eight "in" registers (r[24] to r[31]), whenever the active window is Window Zero. Registers r[8] and r[24] correspond to the first thirty-two bits of Rows Zero and One respectively, with each succeeding group of thirty-two bits assigned to the succeeding register number. Thus, registers r[15] and r[31] correspond to the last group of thirty-two bits in Rows Zero and One respectively.

Referring back to FIG. 8, the data currently stored in all eight memory locations of Row Zero (Shared Half 184), are now currently the eight Shared operands of the "out" registers. This operand data is made available to the Operand Vector Multiplexers (72, 74 FIG. 8) via the Even Operand Outputs (i.e. 320, 324 and 328, FIG. 11), which correspond to the EVEN-OP lines 124 in FIG. 8. New operand data may be stored into the "out" registers by introducing new data via the Row Zero Cells, Even Result Inputs (i.e. 310, 314 and 318, FIG. 11), which correspond to the EVEN-RESULT lines 97 in FIG. 8. Likewise, the data stored in all eight memory locations of Row One (Shared Half 184) is currently the Shared operands of the "in" registers. This operand data is made available to the Operand Vector Multiplexers (72, 74 FIG. 8) via the Row One Cells' Odd Operand Outputs (i.e. 322, 326 and 330, FIG. 11), which correspond to the ODD-OP lines 122 in FIG. 8. New operand data may be stored into the "in" registers by introducing new data via the Row One Cells' Odd Result Inputs (i.e. 308, 312 and 316, FIG. 11), which correspond to the ODD-RESULT lines 95 in FIG. 8.

It should be noted that if the active window becomes Window One, the "out" registers will then be accessed by the ODD-OP 122 and ODD-RESULT 95 lines (FIG. 8). The "in" registers will then be accessed by the EVEN-OP 124 and EVEN-RESULT 97 lines (FIG. 8). This is because the storage for the "out" registers would then be provided by an odd-numbered row, the storage for the "in" registers would be provided by an even-numbered row. Because access to these registers "flip-flops," depending upon whether the active window is odd or even-numbered, the least significant bit of CWP (CWP[0] 11, 94, FIG. 8) is provided to the Store and Read Register Decode Logic (76, 82 FIG. 8) by lines 96 and 138. This information instructs the Operand Vector Multiplexers (72, 74 FIG. 8) and the Result Vector Driver 68 (FIG. 8) whether to expect access to) the contents of the "out" registers on EVEN-OP lines and "in" registers on ODD-OP lines (the case for an even-numbered window), or vice-versa (the case for an odd-numbered window). Because this situation is logically rectified internally to the preferred embodiment, it is completely transparent to the CPU.

As stated earlier, the single row of Local RAM bit cells in the Global portion (101, FIG. 8) of the RAM Array (70, FIG. 8) is permanently enabled. (This row has been omitted from FIG. 11 for simplicity). That is, a single Global-Wordline 99 and Global-Wordline-R 97 (FIG. 8) are permanently active independent of the value of CWP. Thus, the data currently stored in all eight memory locations of this single row (Global portion 101), which is always the Global operands of the Global registers (r[0]-r[7]), is made available to the Operand Vector Multiplexers (72, 74 FIG. 8) via the Operand outputs of the cells in the row (not shown in FIG. 11), which correspond to the Global lines 118 in FIG. 8. Further, new Global Operand data may be stored into the Global registers by introducing new data via the Global Row's Cells Result inputs (not shown in FIG. 11), which correspond to the Global lines 91 in FIG. 8.

Because the data stored in all thirty-two memory locations assigned to provide physical storage for the CPU registers is now simultaneously available at the inputs to the Operand Vector Multiplexers (72, 74 FIG. 8), and because new data may be stored into any of those locations via the outputs of the Result Vector Driver (68, FIG. 8), the entire window of thirty-two registers is considered open and available.

For purposes of discussion, let's assume that procedure A calls for the execution of procedure B, and that procedure A must perform an operation on operands stored in certain registers, the result of which must be passed to procedure B. The CPU must therefore, in executing procedure A, access the two source registers to obtain the operands, perform the operation (i.e. addition, multiplication, etc.), and then store the resulting operand back into one of its available "out" registers, e.g. r[8] (FIG. 3). The CPU will first obtain the two source operands. Because we are assuming that the operands for procedure A have already been fetched from main memory and stored in the register file, the CPU can read the operands simply by sending the two, unique five bit register addresses (ADDR-A and ADDR-B) to the Read Register Decode Logic circuits (126, 130 FIG. 8) which activate one of thirty-two Select signals (128, 132 FIG. 8) to the Operand Vector Multiplexers 72 and 74 (FIG. 8). The two Vector Multiplexers (72, 74 FIG. 8) select the vector of thirty-two bits from their inputs which corresponds to the registers addressed, and they pass those vectors to their thirty-two bit operand outputs (134, 136 FIG. 8). The CPU then reads the operand values from the multiplexer outputs. (Operand A 134 and B 136, FIG. 8). The CPU will then perform the operation between the two operands called for by procedure A, such as addition, thus creating the result operand. The process of storing the result operand back into the "out" register r[8] (FIG. 3) occurs in the following steps.

The CWP is still pointing to Window Zero of the register file, because procedure A is still being executed. Thus, the CWP has also been decoded by the Write Decode Logic circuit (78, FIG. 8), thereby activating the Local-Wordline-R (106, FIG. 8, 186, FIG. 11) associated with Row Zero in the Local portion (103, FIG. 8, 181, FIG. 11) of the RAM Array (70, FIG. 8). In addition, the Shared-Wordline-R (108, FIG. 8, 187, FIG. 11) corresponding to Row Zero and Shared-Wordline-R associated with Row One in the Shared portion (105, FIG. 8, 191, FIG. 11) of the RAM Array (70, FIG. 8) have both been activated as previously discussed. In this way, the two hundred fifty-six "Local" RAM cells providing storage for the eight local registers in Row Zero of the Local portion (103, FIG. 8, 181, FIG. 11) of the RAM Array are ready to store any operand present on the Result input lines (93, FIG. 8, 218, 220 and 222 FIG. 11). Likewise, the two hundred fifty-six "Shared" RAM cells in Row Zero of the Shared portion (105, FIG. 8, 184, FIG. 11) of the RAM Array, (providing storage for the "out" registers of Window Zero), are ready to store any operand present on the Even Result Input lines (i.e. 210, 314 and 318 FIG. 11). The two hundred fifty-six "Shared" RAM cells in Row One of the Shared portion (105, FIG. 8, 332, 334 and 336, FIG. 11) of the RAM Array (providing storage for the eight "in" registers of Window Zero) are ready to store any operand present on the Odd Result Input lines (i.e. 338, 340 and 342, FIG. 11).

The data representing the thirty-two bit Result operand to be stored in r[8] is presented by the CPU on the Result input bus 88 and thereby input to the Result Vector Driver (68, FIG. 8). The CPU sends an appropriate register address value for r[8] over the ADDR-R input bus 90 to the Stored Register Decode Logic circuit (76, FIG. 8). The Store Register Decode Logic circuit 76 then activates the one of thirty-two Select-R lines (92, FIG. 8) in accordance with the register address, which causes the Result Vector Driver (68, FIG. 8) to pass the data on the Result bus (88, FIG. 8) to the Even Result Input lines of the first thirty-two "Shared" RAM cells in Row Zero of the RAM Array (70, FIG. 8). The first thirty-two RAM cells correspond to register r[8] of Window Zero. The operand is then latched into the thirty-two Shared RAM cells, which physically provide the storage for r[8]. Those skilled in the art will understand that the timing for strobing the data into the RAM Array uses conventional methods and they are not unique to the present invention nor are they discussed. The manner by which the preferred embodiment passes the result operand stored in r[8] to the next routine through its overlapping windows of memory locations is now discussed.

Assume that procedure A calls for the execution of procedure B. By virtue of the CPU executing the instruction in procedure A which "calls" procedure B, the CWP is decremented to seven (binary 111). This value of the CWP is immediately decoded by the Read Decode Logic circuit (80, FIG. 8). The appropriate Local/Shared-Wordlines (112, 110 FIG. 8) are activated as in the manner described previously for Window Zero. Referring to FIG. 11, the Local-Wordline Seven 216 coupled to Row Seven is activated and the data stored in the row's two hundred and fifty-six "Local" RAM cells (i.e. 266, 268 and 270, FIG. 11) in the Local Half (180, FIG. 11) of the RAM Array will be made available at the cells' Operand Output lines (i.e. 219, 221 and 223 FIG. 11). Simultaneously the Shared-Wordline Seven (217, FIG. 11) coupled to Row Seven is also activated and the data stored in the two hundred and fifty-six "Shared" RAM cells (i.e. 374, 376 and 378, FIG. 11) for Row Seven in the RAM Array are made available on their respective Odd Operand Output lines (i.e. 322, 326, and 330 FIG. 11). Specifically, the Local-Wordline Seven (216, FIG. 11) for Row Seven is input into Or gate 276(P) (FIG. 11) and output as Shared-Wordline Seven (217, FIG. 11) to the Shared RAM cells in Row Seven (i.e. 374, 376 and 378, FIG. 11). When the Shared-Wordline Seven (217, FIG. 11) is activated these RAM cells provide storage for the eight "out" operands stored in the eight "out" registers of Window Seven.

Simultaneously, the Shared-Wordline Zero (189, FIG. 11) coupled to Row Zero is also activated (because the register file is circular, Row Zero follows Row Seven) and the data stored in the two hundred and fifty-six "Shared" RAM cells in Row Zero (i.e. 332, 334, and 336, FIG. 11) in the Shared Half (180, FIG. 11) of the RAM Array is made available on each cells, respective Even Operand Output lines (i.e. 320, 324 and 328, FIG. 11). Specifically, Local-Wordline Seven (216, FIG. 11) is input through line (272, FIG. 11) to Or gate 276(B) (FIG. 11). Or gate 276(B) (FIG. 11) outputs an active signal on Shared-Wordline Zero (189, FIG. 11) which is coupled to Row Zero and which causes the "Shared" RAM cells (i.e. 332, 334 and 336) to output over their Even Operand Output lines (i.e. 320, 324 and 328, FIG. 11) the operand bits which correspond to the "in" registers of Window Seven. At this time, all thirty-two operands associated with Window Seven (global, local, "out" and "in") are currently available as inputs to the Multiplexers (72, 74 FIG. 8).

It should now be noted that, when the active window was Window Zero (during execution of Procedure A), the rows in the Shared Half (184, FIG. 11) of the RAM Array activated were Row Zero (to provide storage for the "out" registers) and Row One (to provide storage for the "in" registers). Further, the operand resulting from the operation performed as part of procedure A was stored in "out" register r[8], the storage for which was provided by the first thirty-two RAM bit cells in Row Zero. When the CPU executed the instruction in procedure A calling for the execution of procedure B, the value of CWP was decremented to seven from zero, activating Window Seven. The rows of memory locations activated in the Shared Half (184, FIG. 11) of the RAM Array were changed to Row Seven (to provide storage for the "out" registers) and Row Zero (to provide storage for the "in" registers). While the operand data previously stored in the first thirty-two Shared RAM bit cells in Row Zero physically remains, that location no longer provides storage for "out" register r[8]. That physical memory location is now assigned to provide storage for "in" register r[24], while the first thirty-two bits of Row Seven are currently assigned to provide storage for r[8]. Thus, the CPU may have access to the operand generated while executing procedure A, for purposes of executing procedure B, simply by issuing the unique address for r[24]: the operand has been passed from "out" register r[8] to "in" register r[24], even though no physical relocation of the operand has occurred. The operand was figuratively passed through the sharing of the physical memory locations in Row Zero between Window Zero and Window Seven. Finally, upon completion of procedure B, the CPU will return to procedure A and Window Zero reactivated (CWP will be incremented back to zero). The operand value stored in r[24] (i.e. the first thirty-two RAM bit cells in Row Zero) will again be accessible as r[8].

For further clarification, it should be noted that if during procedure B, an instruction calls for the execution of a procedure C, the CWP would be decremented again upon execution of this call instruction, thereby activating (Shared Half 184) Window Six. By the convention previously described, Row Six would be activated to provide storage for the "out" registers and Row Seven (Shared Half 1984) would be activated to provide storage for the "ins." Thus, Row Zero is no longer active and the operand stored in the first thirty-two bits of Row Zero will not be accessible to procedure C. Only adjacent windows can pass operands and Window Zero and Window Six are not adjacent (FIG. 4). Additionally, as illustrated in FIG. 4, the local registers in a given window are never shared. This is accomplished by the preferred embodiment because the memory locations assigned to provide storage for the local registers reside in a separate portion (103, FIG. 8, 180, FIG. 11) of the RAM Array, and each window is assigned a different row of memory locations.

Another point worth clarifying is that when an operand is passed from one window to another as described above, because it resides physically in the same memory location (i.e. the first thirty-two RAM bit cells of Row Zero in the Shared Half (184, FIG. 11), the data is accessible from precisely the same inputs to the Operand Vector Multiplexers (72, 74 FIG. 8) regardless of which of the two adjacent windows is presently active: the first thirty-two EVEN-OP lines (124, FIG. 8). Likewise, the inputs to this location, for purposes of storing new data, remains the first thirty-two EVEN-OP lines (97, FIG. 8) output from the Result Vector Driver (68, FIG. 8). But as previously described, when Window Zero is active the location is accessed (whether for reading or storing) as r[8], but in Window Seven the location is accessed as r[24]. Thus, in Window Zero the CPU will issue a five bit address unique to r[8] to ADDR-R (90, FIG. 8) to store data into the location and ADDR-A or B (140, 144 FIG. 8) to read data from the location. But under an active Window Seven, the address unique to r[24] is issued. The decoded addresses for r[8] and r[24] select two different thirty-two bit vectors, even though physically the vector for this location is the same for both windows. Thus, to select the same fixed vector of thirty-two inputs (EVEN-OP 97) and outputs (EVEN-OP 124) for both windows, the Store Register Decode Logic (76, FIG. 8) and Read Register Decode Logic A or B (82, 84 FIG. 8) are furnished with the least significant bit of the CWP (138, 94 FIG. 8) through lines 96, 138 and 142 respectively.

Through this information, the Read Decode Logic Circuits (76, 82 and 84, FIG. 8) know whether to expect the "out" registers on the EVEN-OP lines (95, 122 FIG. 8) or vice versa. As previously described, the "out" registers (r[8] to r[15]) are provided by the EVEN-OP lines when the active window is even-numbered, and on the ODD-OP lines for odd-numbered windows. The opposite is true for the "in" registers (r[24] to r[31]). Thus, when the active window is Window Zero, "out" register r[8] is expected to be accessed through the vector comprising the first thirty-two EVEN-OP and EVEN-RESULT lines (97, 124 FIG. 8). When the active window is Window One, the Decode Circuits (76, 82 and 84, FIG. 8) knows to expect r[24] to be accessed from the same vector, thereby rectifying the flip-flop between the EVEN-OP and ODD-OP lines previously discussed.

This invention has been described in an exemplary and preferred embodiment, but it is not limited thereto. Those skilled in the art will recognize that a number of additional modifications and improvements can be made to the invention without departure from the essential spirit and scope. For example, a number of different RAM Array configurations would be suitable for implementing the disclosed invention.

What is claimed is:

1. An apparatus for fast access to binary data representing operands, said apparatus comprising:
    an array means for storing a plurality of operands, said array means comprising a plurality of memory locations, each of said plurality of memory locations for storing an operand, said plurality of memory locations being organized into a plurality of windows, each of said plurality of windows having a combination of said plurality of memory locations assigned to it;
    a window pointer means, coupled to said array means, for identifying which one of said plurality of windows is currently active, and for accessing said combination of said plurality of memory locations of said currently active window;
    at least one operand multiplexer means, coupled to said array means, for selecting and outputting at least one operand stored in said accessed combination of said plurality of memory locations of said currently active window; and all of the operands stored in said accessed combination of said plurality of memory locations of said currently active window are simultaneously available for selection by said at least one operand multiplexer means.

2. The apparatus of claim 1, further comprising a read register decode means, coupled to said operand multiplexer means, for identifying said at least one operand selected and outputted by said at least one multiplexer means.

3. The apparatus of claim 2, further comprising at least one result driver means, coupled to said array means, for selecting at least one of said accessed combination of said plurality of memory locations of said currently active window, and for outputting at least one new operand to be stored in said selected at least one of said accessed combination.

4. The apparatus of claim 3, further comprising a write register decode means, coupled to said result driver means, for identifying said at least one of said accessed combination of said plurality of memory locations of said currently active window selected by said result driver means to receive the at least one new operand.

5. The apparatus of claim 4, wherein said window pointer means further comprises a read decode means, coupled to said array means, for forcing said combination of said plurality of memory locations of said currently active window to output all of the operands stored therein to said at least one operand multiplexer means.

6. The apparatus of claim 5, wherein said window pointer means further comprises a write decode means, coupled to said array means, for forcing said at least one of said combination of said plurality of memory locations of said currently active window selected by sad result driver means, to store the at least one operand outputted by said result driver means.

7. The apparatus of claim 1 or claim 6, wherein said array means further comprises:

a global section, comprising at least one of said plurality of memory locations for storing global operands;

a local section, comprising at least one of said plurality of memory locations for storing local operands; and a shared section, comprising at least one of said plurality of memory locations for storing shared operands.

8. The apparatus of claim 7, wherein said at least one global memory location is assigned to each of said plurality of windows, and wherein each of said at least one local memory locations is assigned to a different one of said plurality of windows, and wherein each of said at least one shared memory locations is assigned to two of said plurality of windows.

9. The apparatus of claim 8, wherein said global section is comprised of at least one global row having at least one of said global memory locations, said local section is comprised of a number of local rows reach having at least one of said local memory locations, said number of local rows equal to the number of said plurality of windows, and said shared section is comprised of a number of shared rows each having at least one of said shared memory locations, said number of shared rows equal to the number of said plurality of windows.

10. The apparatus of claim 9, wherein said at least one row of said at least one global memory locations is assigned to each one of said plurality of windows, each one of said number of local rows is assigned to a different one of said plurality of windows, and each pair of numerically adjacent shared rows is assigned to a different one of said plurality of windows.

11. The apparatus of claim 10, wherein only one of said eight windows is currently active.

12. The apparatus of claim 11, wherein each of said plurality of memory locations comprises a plurality of memory cells, each of said plurality of memory cells for storing one binary bit of the operand stored in each of said memory locations.

13. The apparatus of claim 12, wherein the number of memory cells comprising each of said plurality of memory locations is the same, and the number of said at least one local memory locations comprising each of said local rows of said local section is equal to the number of said at least one shared memory locations comprising each of said shared rows of said shared section.

* * * * *

UNITED STATES PATENT AND TRADEMARK OFFICE
CERTIFICATE OF CORRECTION

Page 1 of 2

PATENT NO. : 5,226,142
DATED : July 6, 1993
INVENTOR(S) : Vegesna et al.

It is certified that error appears in the above-identified patent and that said Letters Patent is hereby corrected as shown below:

On the title page: Item [54] and Column 1, line 1 "HIGHH" and insert --HIGH--

Column 1, line 1, cancel "HIGHH" and insert --HIGH--
Column 4, line 43, cancel "anyone" and insert --any one--
Column 5, line 30, cancel "Will" and insert --will--
Column 6, line 39, cancel "FIG" and insert --FIGS--
Column 6, line 39, after "11c" and before "a detailed" insert --depict--
Column 6, line 51, cancel "Window" and insert --window--
Column 7, line 53, after "can" insert --activate--
Column 8, line 58, cancel "Hun" and insert --hun--
Column 9, line 12, cancel "30)inputs" and insert --30) inputs--
Column 10, line 17, after "parts" cancel ";" and insert --:--
Column 10, line 27, after "bus" cancel ";" and insert --:--
Column 12, line 41, cancel "11I" and insert --111--
Column 13, line 46, cancel "ODD-Op" and insert --ODD-OP--
Column 13, line 46, cancel "EVEN-Op" and insert --EVEN-OP--
Column 15, line 23, cancel "become" and insert --becomes--
Column 16, line 8, cancel "corresponds" and insert --correspond--
Column 17, line 16, after "to" and before "odd" insert --the--
Column 20, line 15, after "Cells" cancel --,--
Column 20, line 43, cancel "to)" and insert --to--
Column 20, line 53, cancel "simplicity)." and insert --simplicity.)--

UNITED STATES PATENT AND TRADEMARK OFFICE
CERTIFICATE OF CORRECTION

PATENT NO. : 5,226,142

DATED : July 6, 1993

INVENTOR(S) : Vagesna et al.

It is certified that error appears in the above-identified patent and that said Letters Patent is hereby corrected as shown below:

Column 21, line 59, cancel "210" and insert --310--
Column 22, line 57, after "cells" cancel --,--

Column 25, line 38, cancel "sad" and insert --said--
Column 26, line 17, cancel "reach" and insert --each--
Column 26, line 25, cancel "locations"and insert --location--

Signed and Sealed this

Eighteenth Day of July, 1995

Attest:

BRUCE LEHMAN

Attesting Officer     Commissioner of Patents and Trademarks